(12) United States Patent
Baselmans et al.

(10) Patent No.: US 11,561,478 B2
(45) Date of Patent: Jan. 24, 2023

(54) DETERMINING SUBSET OF COMPONENTS OF AN OPTICAL CHARACTERISTIC OF PATTERNING APPARATUS

(71) Applicant: ASML NETHERLANDS B.V., Veldhoven (NL)

(72) Inventors: Johannes Jacobus Matheus Baselmans, Oirschot (NL); Paulus Jacobus Maria Van Adrichem, Wijchen (NL); Egbert Lenderink, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/419,360

(22) PCT Filed: Dec. 12, 2019

(86) PCT No.: PCT/EP2019/084821
§ 371 (c)(1),
(2) Date: Jun. 29, 2021

(87) PCT Pub. No.: WO2020/141051
PCT Pub. Date: Jul. 9, 2020

(65) Prior Publication Data
US 2022/0082943 A1 Mar. 17, 2022

Related U.S. Application Data

(60) Provisional application No. 62/786,642, filed on Dec. 31, 2018.

(51) Int. Cl.
*G03F 7/20* (2006.01)
(52) U.S. Cl.
CPC .............. *G03F 7/705* (2013.01); *G03F 7/706* (2013.01); *G03F 7/70258* (2013.01)

(58) Field of Classification Search
CPC .. G03F 7/705; G03F 7/70091; G03F 7/70141; G03F 7/70258; G03F 7/706;
(Continued)

(56) References Cited

U.S. PATENT DOCUMENTS 7,587,704 B2  9/2009  Ye et al.
8,200,468 B2  6/2012  Ye et al.
(Continued)

FOREIGN PATENT DOCUMENTS

CN  101271268  9/2008
CN  102656515  9/2012
(Continued)

OTHER PUBLICATIONS

International Search Report issued in corresponding PCT Patent Application No. PCT/EP2019/084821, dated Apr. 14, 2020.
(Continued)

*Primary Examiner* — Christina A Riddle
(74) *Attorney, Agent, or Firm* — Pillsbury Winthrop Shaw Pittman LLP

(57) ABSTRACT

A method for determining a component of optical characteristic of a patterning process. The method includes obtaining (i) a plurality of desired features, (ii) a plurality of simulated features based on the plurality of desired features and an optical characteristic of a patterning apparatus, and (iii) a performance metric (e.g., EPE) related to a desired feature of the plurality of desired features and an associated simulated feature of the plurality of simulated features; determining a set of optical sensitivities of the patterning process by computing a change in value of the performance metric based on a change in value of the optical characteristic; and identifying, based on the set of optical sensitivities, a set of components (e.g., principal components) of the
(Continued)

optical characteristic that include dominant contributors in changing the value of the performance metric.

20 Claims, 23 Drawing Sheets

(58) Field of Classification Search
CPC ....... G03F 7/70; G03F 7/70483–70541; G03F 7/70591; G03F 7/70608–70683; G03F 7/70283; G03F 7/70316; G03F 7/70325; G03F 7/70425; G03F 7/70433; G03F 7/70441
USPC .................................. 355/30, 52–55, 67–77
See application file for complete search history.

(56) References Cited

U.S. PATENT DOCUMENTS

| | | | |
|---|---|---|---|
| 2002/0159040 | A1 | 10/2002 | Hamatani et al. |
| 2004/0053148 | A1* | 3/2004 | Morohoshi ......... G03F 7/70133 430/311 |
| 2005/0024612 | A1 | 2/2005 | Hirukawa et al. |
| 2005/0076322 | A1 | 4/2005 | Ye et al. |
| 2005/0210438 | A1 | 9/2005 | Verstappen et al. |
| 2006/0066841 | A1 | 3/2006 | Slonaker |
| 2006/0119822 | A1 | 6/2006 | Fehr et al. |
| 2007/0031745 | A1 | 2/2007 | Ye et al. |
| 2007/0050749 | A1 | 3/2007 | Ye et al. |
| 2008/0301620 | A1 | 12/2008 | Ye et al. |
| 2008/0309897 | A1 | 12/2008 | Wong et al. |
| 2010/0122225 | A1* | 5/2010 | Cao .................. G06F 30/20 716/136 |
| 2010/0162197 | A1 | 6/2010 | Ye et al. |
| 2010/0180251 | A1 | 7/2010 | Ye et al. |
| 2010/0315614 | A1 | 12/2010 | Hansen |
| 2011/0099526 | A1 | 4/2011 | Liu |
| 2012/0262686 | A1 | 10/2012 | Laidig |
| 2015/0186581 | A1 | 7/2015 | Chen et al. |
| 2015/0253680 | A1* | 9/2015 | Shiozawa ............ G03F 7/706 355/55 |
| 2016/0299436 | A1 | 10/2016 | Rist |
| 2017/0023358 | A1 | 1/2017 | Lee et al. |
| 2017/0255112 | A1 | 9/2017 | Van Leest et al. |
| 2018/0364589 | A1 | 12/2018 | Chen et al. |
| 2018/0373162 | A1 | 12/2018 | Slotboom et al. |
| 2019/0369480 | A1 | 12/2019 | Hansen et al. |
| 2021/0247698 | A1* | 8/2021 | Smeets ............... G03F 7/70525 |

FOREIGN PATENT DOCUMENTS

| | | |
|---|---|---|
| TW | 201732454 | 9/2017 |
| TW | 201743143 | 12/2017 |
| TW | 201821906 | 6/2018 |
| WO | 2009065359 | 5/2009 |
| WO | 2010059954 | 5/2010 |
| WO | 2018050432 | 3/2018 |
| WO | 2019029933 | 2/2019 |
| WO | 2020002143 | 1/2020 |

OTHER PUBLICATIONS

Taiwanese Office Action issued in corresponding Taiwanese Patent Application No. 108147771, dated Nov. 20, 2020.
Spence, C.: "Full-Chip Lithography Simulation and Design Analysis—How OPC Is Changing IC Design", Proc. of SPIE, vol. 5751, pp. 1-14 (2005).
Granik, Y.: "Source Optimization for Image Fidelity and Throughput", Journal of Microlithography, Microfabrication, Microsystems 3(4), pp. 509-522 (2004).
Rosenbluth et al.: "Optimum Mask and Source Patterns to Print a Given Shape", Journal of Microlithograghy, Microfabrication, Microsystems 1(1), pp. 13-20 (2002).
Socha et. al.: "Simultaneous Source Mask Optimization (SMO)", Proc. of SPIE, vol. 5853 (2005).
Nocedal, J. et al.: "Numerical Optimization", Springer, Berlin, New York: Vandenberghe. Cambridge University Press (2006).
Y. Cao et al.: "Optimized Hardware and Software for Fast, Full Chip Simulation", Proc. of SPIE, vol. 5754 (2005).
Taiwanese Office Action issued in corresponding Taiwanese Patent Application No. 110122896, dated Oct. 21, 2021.

* cited by examiner

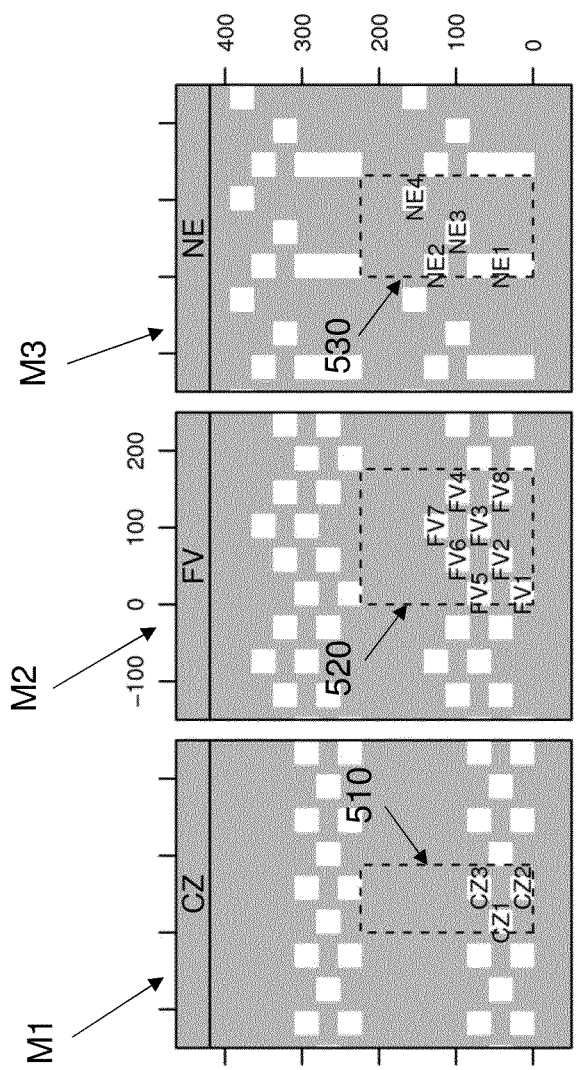

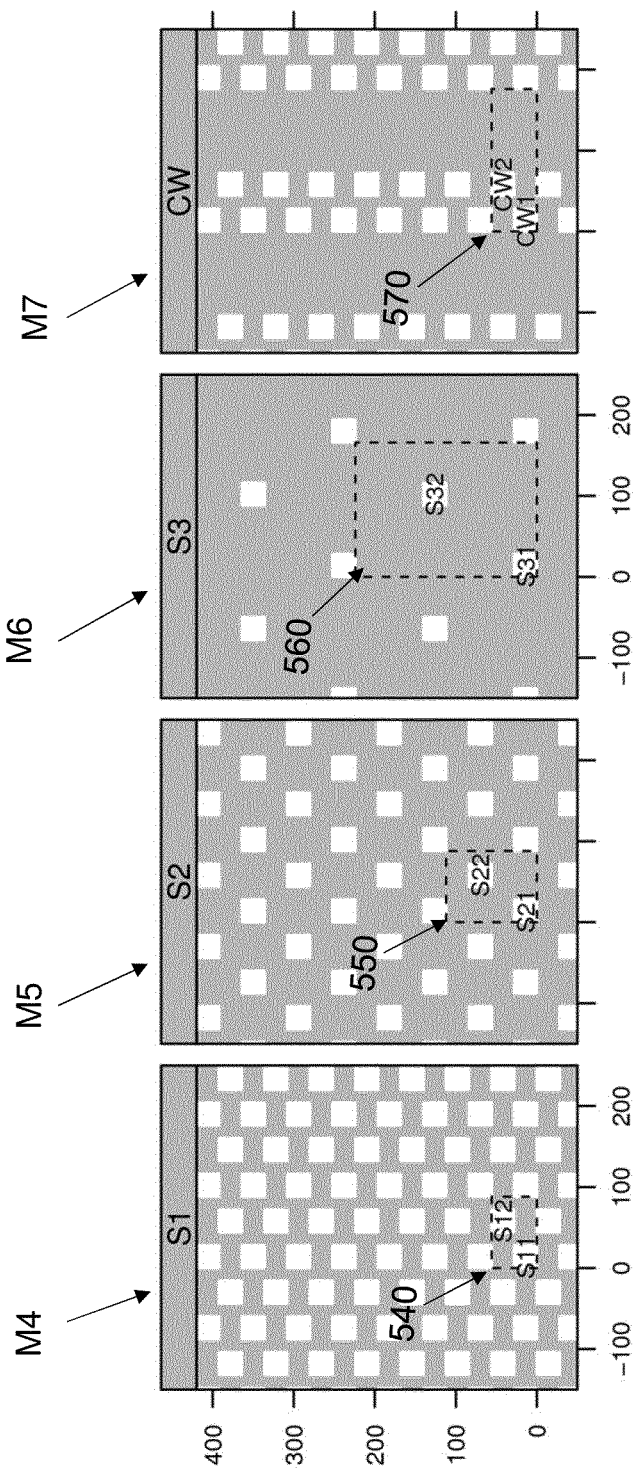

Zernike coefficient

DETERMINING SUBSET OF COMPONENTS OF AN OPTICAL CHARACTERISTIC OF PATTERNING APPARATUS

CROSS-REFERENCE TO RELATED APPLICATIONS

This application is the U.S. national phase entry of PCT Patent Application No. PCT/EP2019/084821 which was filed on Dec. 12, 2019, which claims the benefit of priority of U.S. Patent Application No. 62/786,642 which was filed on Dec. 31, 2018 and which is incorporated herein in its entirety by reference.

FIELD

The description herein relates to patterning apparatuses and processes, and more particularly to a method or tool for tuning of an apparatus of a patterning process, such as optical parameters related to a lithographic apparatus.

BACKGROUND

A lithography apparatus is a machine that applies a desired pattern onto a target portion of a substrate. A lithography apparatus can be used, for example, in the manufacture of devices such as integrated circuits (ICs). In that circumstance, a patterning device (e.g., a mask or a reticle) may be used to generate a pattern corresponding to an individual layer of the device, and this pattern can be transferred onto a target portion (e.g. comprising part of, one or several dies) on a substrate (e.g. a silicon wafer) that has, e.g., a layer of radiation-sensitive material (resist), by methods such as irradiating the target portion via a pattern on the patterning device. In general, a single substrate will contain a plurality of adjacent target portions to which the pattern is transferred successively by the lithographic apparatus, one target portion at a time. In one type of lithographic apparatus, the pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, a lithographic projection apparatus will have a demagnification factor M (generally >1), the speed F at which the substrate is moved will be a factor M times that at which the projection beam scans the patterning device.

Prior to transferring the pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

SUMMARY

Optical systems can play a role in the performance of a patterning process. Accordingly, there is provided herein a technique to enable patterning process design, modification, control, etc. based on a characteristic of an optical system of a patterning apparatus such as a scanner.

In an embodiment, there is provided a method for determining a component of optical characteristic of a patterning process. The method involves obtaining (i) a plurality of desired features, (ii) a plurality of simulated features based on the plurality of desired features and an optical characteristic of the patterning process, and (iii) a performance metric related to a desired feature of the plurality of desired features and an associated simulated feature of the plurality of simulated features; determining a set of optical sensitivities of the patterning process by computing a change in value of the performance metric based on a change in value of the optical characteristic; and identifying, based on the set of optical sensitivities, a set of components of the optical characteristic that comprise dominant contributors in changing the value of the performance metric.

In an embodiment, the identifying the set of components of the optical characteristic involves performing a principal component analysis on the set of optical sensitivities; and determining a linear combination of the optical characteristic that accounts for substantial variations within the set of optical sensitivities.

In an embodiment, the dominant contributors comprise the linear combination of the optical characteristic.

In an embodiment, the optical characteristic characterizes an optical aberration of an optical system of the patterning apparatus.

In an embodiment, the optical characteristic is defined via a Zernike polynomial.

In an embodiment, a component of the set of components of the optical characteristic is a coefficient of the Zernike polynomial.

In an embodiment, the component corresponds to a correctable Zernike coefficient, wherein the correctable Zernike coefficient is tunable via an adjustment mechanism of the patterning apparatus.

In an embodiment, the linear combination includes a correctable Zernike coefficient and a non-correctable Zernike coefficient, wherein the non-correctable Zernike coefficient is not tunable via an adjustment mechanism of the patterning apparatus.

In an embodiment, the correctable Zernike coefficient is a low order Zernike coefficient.

Furthermore, in an embodiment, there is provided a method of source mask optimization based on optical sensitivity of a patterning process. The method involves obtaining (i) a set of optical sensitivities, and (ii) a set of components including an optical characteristic that are dominant contributors to variations in the set of optical sensitivities; determining, via a patterning process model, source pattern or mask pattern based on the set of components including the optical characteristic such that a performance metric of the patterning process is improved.

Furthermore, in an embodiment, there is provided a computer program product comprising a non-transitory computer readable medium having instructions recorded thereon, the instructions when executed by a computer system implementing the aforementioned methods.

BRIEF DESCRIPTION OF THE DRAWINGS

The above aspects and other aspects and features will become apparent to those ordinarily skilled in the art upon review of the following description of specific embodiments in conjunction with the accompanying figures, wherein:

FIGS. 5A, 5B, 5C, 5D, 5E, 5F, and 5G illustrate different a mask pattern or desired patterns to be printed on a wafer, according to an embodiment;

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

DETAILED DESCRIPTION

Before describing embodiments in detail, it is instructive to present an example environment in which embodiments may be implemented.

Figure 1:
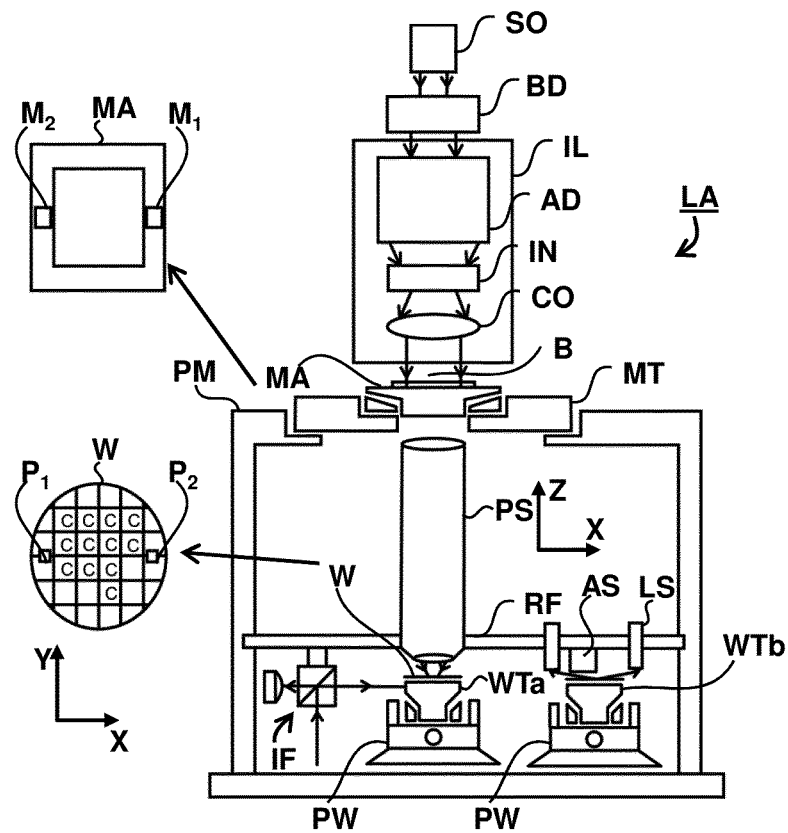
FIG. 1 schematically depicts a lithography apparatus, according to an embodiment.

FIG. 1 schematically depicts an embodiment of a lithographic apparatus LA. The apparatus comprises:

an illumination system (illuminator) IL configured to condition a radiation beam B (e.g. extreme ultra violet (EUV) radiation or electromagnetic radiation such as UV radiation or DUV);

a support structure (e.g. a mask table) MT constructed to support a patterning device (e.g. a mask) MA and connected to a first positioner PM configured to accurately position the patterning device in accordance with certain parameters; a substrate table (e.g. a wafer table) WT (e.g., WTa, WTb or both) constructed to hold a substrate (e.g. a resist-coated wafer) W and connected to a second positioner PW configured to accurately position the substrate in accordance with certain parameters; and a projection system (e.g. a refractive, catoptric or catadioptric projection system) PS configured to project a pattern imparted to the radiation beam B by patterning device MA onto a target portion C (e.g. comprising one or more dies and often referred to as fields) of the substrate W, the projection system supported on a reference frame (RF).

As here depicted, the apparatus is of a transmissive type (e.g. employing a transmissive mask). Alternatively, the apparatus may be of a reflective type (e.g. employing a programmable mirror array or LCD matrix, or employing a reflective mask).

The illuminator IL receives a beam of radiation from a radiation source SO (e.g., a mercury lamp or excimer laser). The radiation source and the lithographic apparatus may be separate entities, for example when the radiation source is an excimer laser. In such cases, the radiation source is not considered to form part of the lithographic apparatus and the radiation beam is passed from the radiation source SO to the illuminator IL with the aid of a beam delivery system BD comprising for example suitable directing mirrors and/or a beam expander. In other cases the radiation source may be an integral part of the apparatus, for example when the radiation source is a mercury lamp. The radiation source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

So, the illuminator IL may comprise adjuster AM configured to adjust the (angular/spatial) intensity distribution of the beam. Generally, at least the outer and/or inner radial extent (commonly referred to as σ-outer and σ-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable alter the polarization of the beam and may be operable to adjust the polarization using adjuster AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illumination system may include various types of optical components, such as refractive, reflective, magnetic, electromagnetic, electrostatic or other types of optical components, or any combination thereof, for directing, shaping, or controlling radiation.

Thus, the illuminator provides a conditioned beam of radiation B, having a desired uniformity and intensity distribution in its cross section.

The support structure MT supports the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a pattern in a target portion of the substrate. In an embodiment, a patterning device is any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basic functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The diffraction grating may be sequentially scanned in two perpendicular directions, which may coincide with axes of a co-ordinate system of the projection system PS (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used.

The projection system PS may comprise a plurality of optical (e.g., lens) elements and may further comprise an adjustment mechanism AM configured to adjust one or more of the optical elements so as to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; and/or deform one or more optical elements. Displacement of an optical element may be in any direction (x, y, z or a combination thereof). Tilting of an optical element is typically out of a plane perpendicular to the optical axis, by rotating about an axis in the x and/or y directions although a rotation about the z axis may be used for a non-rotationally symmetric aspherical optical element. Deformation of an optical element may include a low frequency shape (e.g. astigmatic) and/or a high frequency shape (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

So, in operation of the lithographic apparatus, a radiation beam is conditioned and provided by the illumination system IL. The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
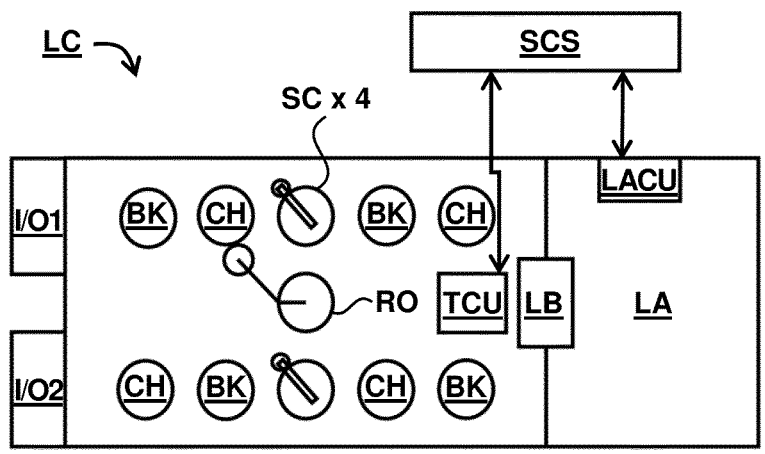
FIG. 2 schematically depicts an embodiment of a lithographic cell or cluster, according to an embodiment.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

As device manufacturing processes used to manufacture devices such as ICs continue to advance, the dimensions of functional elements have continually been reduced while the amount of functional elements, such as transistors, per device has been steadily increasing over decades, following a trend commonly referred to as "Moore's law". To enable this, some processes aim to create patterns at or below the classical resolution limit.

The process in which features with dimensions smaller than the classical resolution limit of a lithographic projection apparatus are printed, is commonly known as low-$k_1$ lithography, according to the resolution formula $CD=k_1\times\lambda/NA$, where $\lambda$ is the wavelength of radiation employed (e.g., 193 nm or about 13 nm, e.g., about 13.5 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a device designer in order to achieve particular electrical functionality and performance. To overcome these difficulties, sophisticated fine-tuning steps are applied to the lithographic projection apparatus and/or patterning device pattern. These include, for example, but not limited to, optimization of optical coherence settings, customized illumination schemes, use of phase shifting patterning devices, optical proximity correction (OPC) in the patterning device pattern, optimization of NA, or other methods generally defined as "resolution enhancement techniques" (RET).

In a lithographic projection apparatus, an illumination system provides illumination (i.e. radiation) to patterning device and projection optics directs the illumination from the patterning device onto a substrate. In an embodiment, the projection optics enables the formation of an aerial image (AI), which is the radiation intensity distribution on the substrate. A resist layer on the substrate is exposed and the aerial image is transferred to the resist layer as a latent "resist image" (RI) therein. The resist image (RI) can be defined as a spatial distribution of solubility of the resist in the resist layer. In an embodiment, simulation of a lithography process can simulate the production of the aerial image and/or resist image.

Figure 3:
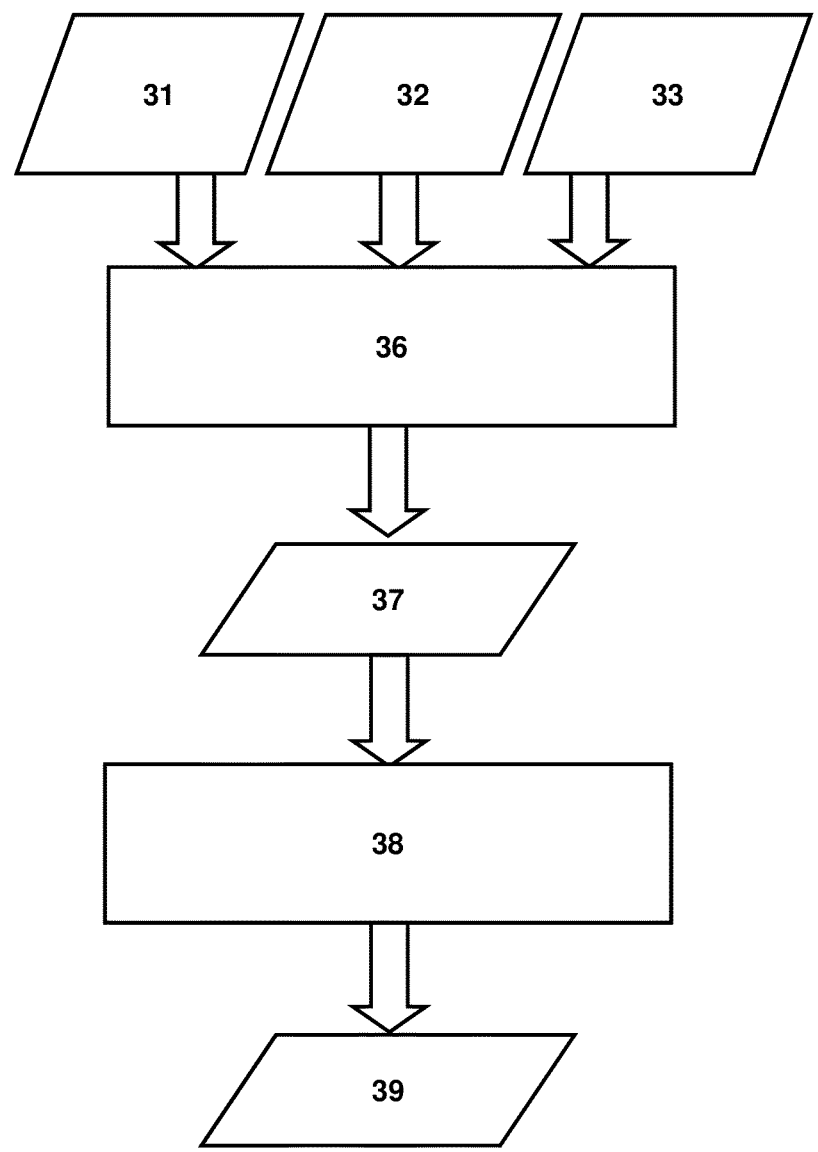
FIG. 3 is a flow chart for modelling and/or simulating parts of a patterning process, according to an embodiment.

An exemplary flow chart for modelling and/or simulating parts of a patterning process is illustrated in FIG. 3. As will be appreciated, the models may represent a different patterning process and need not comprise all the models described below.

An illumination model 31 represents optical characteristics (including radiation intensity distribution and/or phase distribution) of an illumination mode used to generate a patterned radiation beam. The illumination model 31 can represent the optical characteristics of the illumination that include, but not limited to, numerical aperture settings, illumination sigma (σ) settings as well as any particular illumination mode shape (e.g. off-axis radiation shape such as annular, quadrupole, dipole, etc.), where σ (or sigma) is outer radial extent of the illuminator.

A projection optics model 32 represents optical characteristics (including changes to the radiation intensity distribution and/or the phase distribution caused by the projection optics) of the projection optics. The projection optics model 32 may include optical aberrations caused by various factors, for example, heating of the components of the projection optics, stress caused by mechanical connections of the components of the projection optics, etc. The projection optics model 32 can represent the optical characteristics of the projection optics, including one or more selected from: an aberration, a distortion, a refractive index, a physical size, a physical dimension, an absorption, etc. Optical properties of the lithographic projection apparatus (e.g., properties of the illumination, the patterning device pattern and the projection optics) dictate the aerial image. Since the patterning device pattern used in the lithographic projection apparatus can be changed, it is desirable to separate the optical properties of the patterning device pattern from the optical properties of the rest of the lithographic projection apparatus including at least the illumination and the projection optics. The illumination model 31 and the projection optics model 32 can be combined into a transmission cross coefficient (TCC) model.

A patterning device pattern model 33 represents optical characteristics (including changes to the radiation intensity distribution and/or the phase distribution caused by a given patterning device pattern) of a patterning device pattern (e.g., a device design layout corresponding to a feature of an integrated circuit, a memory, an electronic device, etc.), which is the representation of an arrangement of features on or formed by a patterning device. The patterning device model 33 captures how the design features are laid out in the pattern of the patterning device and may include a representation of detailed physical properties of the patterning device and a patterning device pattern, as described, for example, in U.S. Pat. No. 7,587,704, which is incorporated by reference in its entirety.

A resist model 37 can be used to calculate the resist image from the aerial image. An example of such a resist model can be found in U.S. Pat. No. 8,200,468, which is hereby incorporated by reference in its entirety. The resist model typically describes the effects of chemical processes which occur during resist exposure, post exposure bake (PEB) and development, in order to predict, for example, contours of resist features formed on the substrate and so it typically related only to such properties of the resist layer (e.g., effects of chemical processes which occur during exposure, post-exposure bake and development). In an embodiment, the optical properties of the resist layer, e.g., refractive index, film thickness, propagation and polarization effects—may be captured as part of the projection optics model 32.

Having these models, an aerial image 36 can be simulated from the illumination model 31, the projection optics model 32 and the patterning device pattern model 33. An aerial image (AI) is the radiation intensity distribution at substrate level. Optical properties of the lithographic projection apparatus (e.g., properties of the illumination, the patterning device and the projection optics) dictate the aerial image.

A resist layer on a substrate is exposed by the aerial image and the aerial image is transferred to the resist layer as a latent "resist image" (RI) therein. The resist image (RI) can be defined as a spatial distribution of solubility of the resist in the resist layer. A resist image 38 can be simulated from the aerial image 36 using a resist model 37. So, in general, the connection between the optical and the resist model is a simulated aerial image intensity within the resist layer, which arises from the projection of radiation onto the substrate, refraction at the resist interface and multiple reflections in the resist film stack. The radiation intensity distribution (aerial image intensity) is turned into a latent "resist image" by absorption of incident energy, which is further modified by diffusion processes and various loading effects. Efficient simulation methods that are fast enough for full-chip applications approximate the realistic 3-dimensional intensity distribution in the resist stack by a 2-dimensional aerial (and resist) image.

In an embodiment, the resist image can be used an input to a post-pattern transfer process model 39. The post-pattern transfer process model 39 defines performance of one or more post-resist development processes (e.g., etch, CMP, etc.) and can produce a post-etch image.

Thus, the model formulation describes most, if not all, of the known physics and chemistry of the overall process, and each of the model parameters desirably corresponds to a distinct physical or chemical effect. The model formulation thus sets an upper bound on how well the model can be used to simulate the overall manufacturing process.

Simulation of the patterning process can, for example, predict contours, CDs, edge placement (e.g., edge placement error), pattern shift, etc. in the aerial, resist and/or etched image. Thus, the objective of the simulation is to accurately predict, for example, edge placement, and/or contours, and/or pattern shift, and/or aerial image intensity slope, and/or CD, etc. of the printed pattern. These values can be compared against an intended design to, e.g., correct the patterning process, identify where a defect is predicted to occur, etc. The intended design is generally defined as a pre-OPC design layout which can be provided in a standardized digital file format such as GDSII or OASIS or other file format.

Details of techniques and models used to transform a patterning device pattern into various lithographic images (e.g., an aerial image, a resist image, etc.), apply OPC using those techniques and models and evaluate performance (e.g., in terms of process window) are described in U.S. Patent Application Publication Nos. US 2008-0301620, 2007-0050749, 2007-0031745, 2008-0309897, 2010-0162197, 2010-0180251 and 2011-0099526, the disclosure of each which is hereby incorporated by reference in its entirety.

In an embodiment, an optical characteristic of the patterning apparatus (e.g., a scanner) affects the performance of the patterning process. As mentioned earlier, the optical characteristic may be represented by a Zernike polynomial. In an embodiment, the optical characteristic is an optical aberration of a lens of a projection optics of the patterning apparatus. According to an embodiment, the optical aberration may be decomposed into multiple components. For example, the optical aberration may be decomposed into multiple Zernike coefficients (e.g., Z1-Z37), where each Zernike coefficient is associated with a magnitude value. So, in an embodiment, one or more Zernike coefficients and associated magnitude values together determine a value of the optical aberration.

The optical characteristic (e.g., an optical aberration) affects the way a feature (e.g., of a target pattern/desired pattern) will be printed. In an embodiment, one feature may be more sensitive to a particular optical characteristic (e.g., Z8), while another feature may be more sensitive to a different optical characteristic (e.g., Z9). In an embodiment, optical sensitivities may be determined for a limited set of features e.g., corresponding to hot spots or representative features of a pattern to be printed on a substrate. Evaluating optical sensitivities for limited patterns may be desirable since computation times of the simulation of the patterning process such as SO, MO, SMO, or other optimization process, are relatively high for full chip application compared to for clips. Furthermore, based on the optical sensitivities of selected patterns, a limited number of components of optical characteristics is determined to reduce the number of parameters to be tuned to improve performance of the patterning process. Thus, any image tuning recipe based on the tuning parameters will effectively improve the patterning process with low to minimum tuning of e.g., the optical characteristic.

Example mask patterns M1-M7 and selected features therein are illustrated in FIGS. 5A-5G. In an embodiment, the mask patterns M1-M7 may be different portions of a single mask. Each mask pattern (e.g., M1, M2, M3, M4, M5, M6, or M7) includes features corresponding to a part of a desired circuit, e.g., memory, SRAM, microprocessor, desired to be printed on a substrate. Within each mask pattern a set of representative features may be selected for which an optical sensitivity may be determined. According to an embodiment, the selected features are contained within a unit cell that serves as a desired portion (e.g., hot spots or representative portion) of the mask. For example, a first unit cell 510 of mask pattern M1 includes three features, a second unit cell 520 of mask pattern M2 includes seven features, a third unit cell 530 of mask pattern M3 includes four features, a fourth unit cell 540 of mask pattern M4 includes two features, a fifth unit cell 550 of mask pattern M5 includes two features, a sixth unit cell 560 of mask pattern M6 includes two features, and a seventh unit cell 570 of mask pattern M7 includes two features. It can be seen that the features in a unit cell (e.g., 510) have features of similar geometric characteristic such as shape and size and placed at equidistance relative to each other. In another unit cell (e.g., 530), the features have different geometric characteristic such as sizes, as well as the features may be placed at different distances relative to each other.

In an embodiment, such different layouts of features within a unit cell will result in different optical sensitivities. Optical sensitivity relates to a lithographic effect such as an output of a patterning process simulation (e.g., edge placement, CD, line placement, etc.) with an aberration (or wavefront) change. Thus the optical sensitivities can be represented by a sensitivity vector (e.g., d(edge placement)/d(Zernike number)), or a sensitivity wavefront (e.g., d(edge placement)/d(wavefront pixel)).

Depending on how many unit cells and the features therein are evaluated, a large number of optical sensitivity values may be obtained. Furthermore, the features within the unit cell are sensitive to dose and focus values. Thus, in an embodiment, thousands of optical sensitivities may be obtained that cannot possibly be individually tuned to improve the performance of the patterning process. Thus, according to the present disclosure, a method 400, a subset of components of the optical characteristics is determined that may be tuned to improve the performance of the patterning process.

Figure 4:
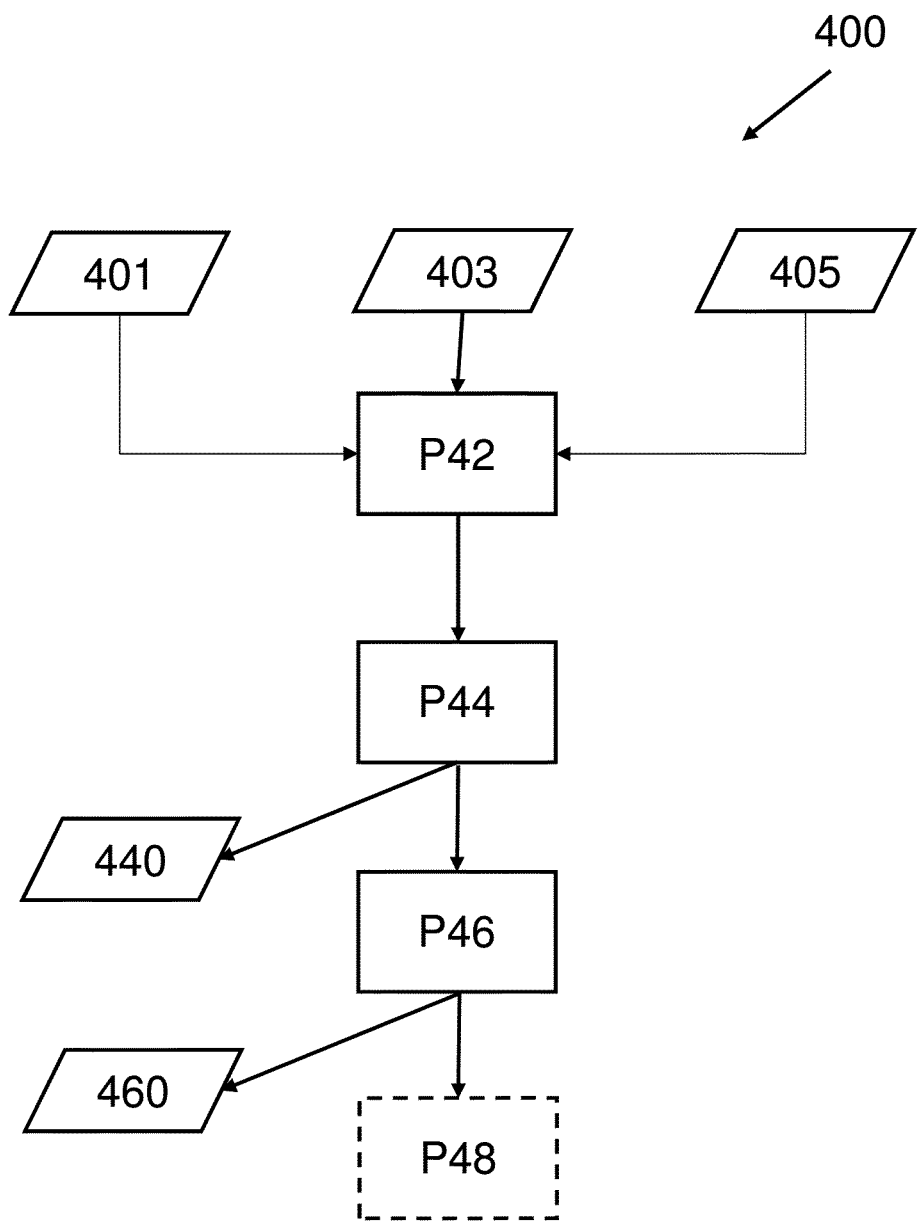
FIG. 4 is a flow chart for determining one or more optical characteristic of a patterning apparatus, according to an embodiment.

FIG. 4 is a method 400 of determining one or more components comprising the optical characteristic (e.g., optical sensitivity or Zernike coefficient corresponding to an optical sensitivity) of a patterning apparatus that primarily affect the performance of the patterning process. In an embodiment, Zernike coefficients approximate an optical wavefront, and further a full wavefront can be approximated by an inner product of the Zernike coefficients with the Zernike polynomials. In an embodiment, optical sensitivities describe how an edge placement is affected by specific Zernikes or a specific wavefront. So, optical sensitivities correspond to a sensitivity vector (or map), where the inner product of the sensitivity vector with the Zernike coefficients describes an expected edge placement. Similarly, taking the inner product of the wavefront sensitivity map with an actual wavefront, returns the expected edge placement.

In an embodiment, the method 400 determines components comprising the optical characteristic (e.g., optical sensitivity or Zernike coefficient corresponding to an optical sensitivity). The optical sensitivity determines how edges of a feature of a pattern are affected upon introducing, for example, an optical aberration during the patterning process. Then, according to an embodiment, the number of optical sensitivities are reduced by a factorization technique that describes the cross-covariance between datasets, for example, a "principle component analysis" (PCA). For example, PCA identifies a linear combination of optical characteristics that explains the major variation in the optical sensitivities. Thus, the optical sensitivities can be characterized by one or more principle components (e.g., P1, P2, P3, etc. comprising linear combinations of optical characteristics such as d/d(Z5), d/d(Z8), d/d(Z7), d/d(Z9), d/d(Z11), etc. sensitivity coefficients). Based on the identified components, the method can be used for a source optimization, a mask optimization, a source mask optimization process, or optimization of other process. Examples of optimization process are discussed with respect to FIG. 11-FIG. 14.

The method 400, in process P42 involves obtaining (i) a plurality of desired features 401, (ii) a plurality of simulated features 403 based on the plurality of desired features 401 and an optical parameter of a patterning apparatus, and (iii) a performance metric 405 related to a desired feature of the plurality of desired features 401 and an associated simulated feature of the plurality of simulated features 403. In an embodiment, a performance metric 405 is a characteristic of a feature of a substrate and/or the patterning process. In an embodiment, the performance metric 405 is at least one of an edge placement error, critical dimension, a displacement between edges of two features on a substrate, and/or other commonly known lithography related performance metric 405.

In an embodiment, the plurality of desired features 401 are selected from one or more portions of a mask pattern such as discussed with respect to FIGS. 5A-5G. In an embodiment, the obtaining the plurality of desired features 401 involves simulating a patterning process model assuming ideal optical characteristic (e.g., no optical aberrations) and perturbing values of a process parameter. For example, a design layout or a mask pattern may be used to simulate patterns on the substrate, thereby obtaining the desired features 401 on the substrate. Accordingly, the patterning process model includes an ideal optics model where values of optical aberration may be zero, and only values of process parameters may be changed. In an embodiment, the process parameter is at least one of dose and/or focus whose values may be varied during the simulation. For example, optical sensitivities are obtained under different process conditions like different dose and focus values.

In an embodiment, the desired features 401 may be a target pattern or a design layout. A desired feature of the plurality of desired features 401 serves as a reference for determining a performance of the patterning apparatus or the patterning process. For example, the desired feature may be compared with a printed feature on a substrate or a predicted feature that are affected by imperfections (e.g., optical aberrations) of the patterning apparatus or the patterning process. In an embodiment, improving the performance of the patterning process involves comparing a real or predicted feature with the desired feature or the reference feature.

The obtaining the plurality of simulated features 403 involves simulating the patterning process model perturbing the optical parameter, and the values of the process parameter to obtain a plurality of simulated features 403 associated with each of the plurality of desired features 401. In an embodiment, the process parameter is at least one of dose and/or focus whose values may be varied during the simulation. Furthermore, the values of the dose and focus used during the simulation are similar to that used for obtaining the desired feature or reference feature.

As mentioned earlier, a desired feature of the plurality of desired feature and an associated simulated feature of the plurality of simulated feature may be compared to obtain the performance metric 405 (e.g., EPE) of the patterning process. For example, EPE between the desired feature and the simulated feature may be determined. In an embodiment, the EPE may be determined in a particular direction such as in horizontal and vertical direction as illustrated in FIGS. 8A and 8B.

Referring back to FIG. 4, the method 400, in process P44 involves determining a set of optical sensitivities 440 of the patterning process by computing a change in value of the performance metric 405 based on a change in value of the optical parameter. In an embodiment, an optical sensitivity of the patterning process is a differential of the performance metric 405 with respect to a Zernike coefficient. Accordingly, a set of optical sensitivities 440 can be obtained by taking a differential of the performance metric 405 with each of the Zernike coefficient.

In an embodiment, the determining of the change in the performance metric 405 involves overlapping the desired feature and the simulated feature; and measuring a difference in a pre-determined direction between overlapping contours of the desired feature and the simulated feature. In an embodiment, the difference is measured in a horizontal direction and/or a vertical direction. Then, the performance metric 405 becomes the EPE along a x-direction and y-direction.

Figure 8A:
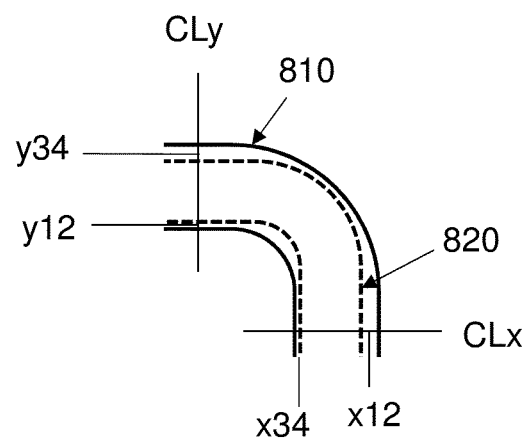
FIGS. 8A and 8B illustrates performance measurement based on contours of a reference feature and a simulated feature (e.g., resulting from perturbing optical characteristic), according to an embodiment.
Figure 8B:
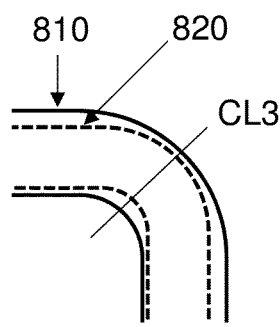

In FIGS. 8A and 8B, a desired feature 810 (also referred as a target feature 810) and a simulated feature 820 are overlapped to determine a difference between contours of the overlapping features 810 and 820. As mentioned earlier, feature 810 can be a desired feature obtained via simulation or a design feature of a design layout. The feature 820 is an example of the simulated feature which is distorted compared to the associated desired feature due to, for example, the perturbation in values of the optical aberration (e.g., magnitude of the Zernike coefficient) of the patterning apparatus.

In an embodiment, the difference is computed along a vertical direction and/or horizontal direction. For example, along cut lines CLy and CLx in FIG. 8A. In an embodiment, difference is a positive when the edge of 820 moves outward with respect to 810 and negative when the edge of 820 moves inwards with respect to 810. Then, the differences along the y-direction are y12 (e.g., 0.1 nm) between points 1 and 2, and y34 (e.g., 0.2 nm) between points 3 and 4. Similarly, the differences along the x-direction are x12 between points 1 and 2, and x34 between points 3 and 4. In an embodiment, the difference can be a sum of difference in a particular direction.

In an embodiment, as shown in FIG. 8B, a difference may be computed along an inclined cut line CL3. In an embodiment, the differences along the inclined cut lines may be resolved in x-component (along x-axis) and y-component (along y-axis) using simple trigonometric relationship. Then, the x-differences and y-difference may be used further, for example, during the PCA. Such difference in edges is referred as EPE, which may be used as the performance metric 405.

When the edge placement error is used as the performance metric 405 and the optical characteristic is defined by a Zernike polynomial, then an optical sensitivity vector of the patterning process is computed using following differential equation:

$$\text{optical sensitivity} = \frac{\partial EPE_k}{\partial Z_n}$$

Figure 6:
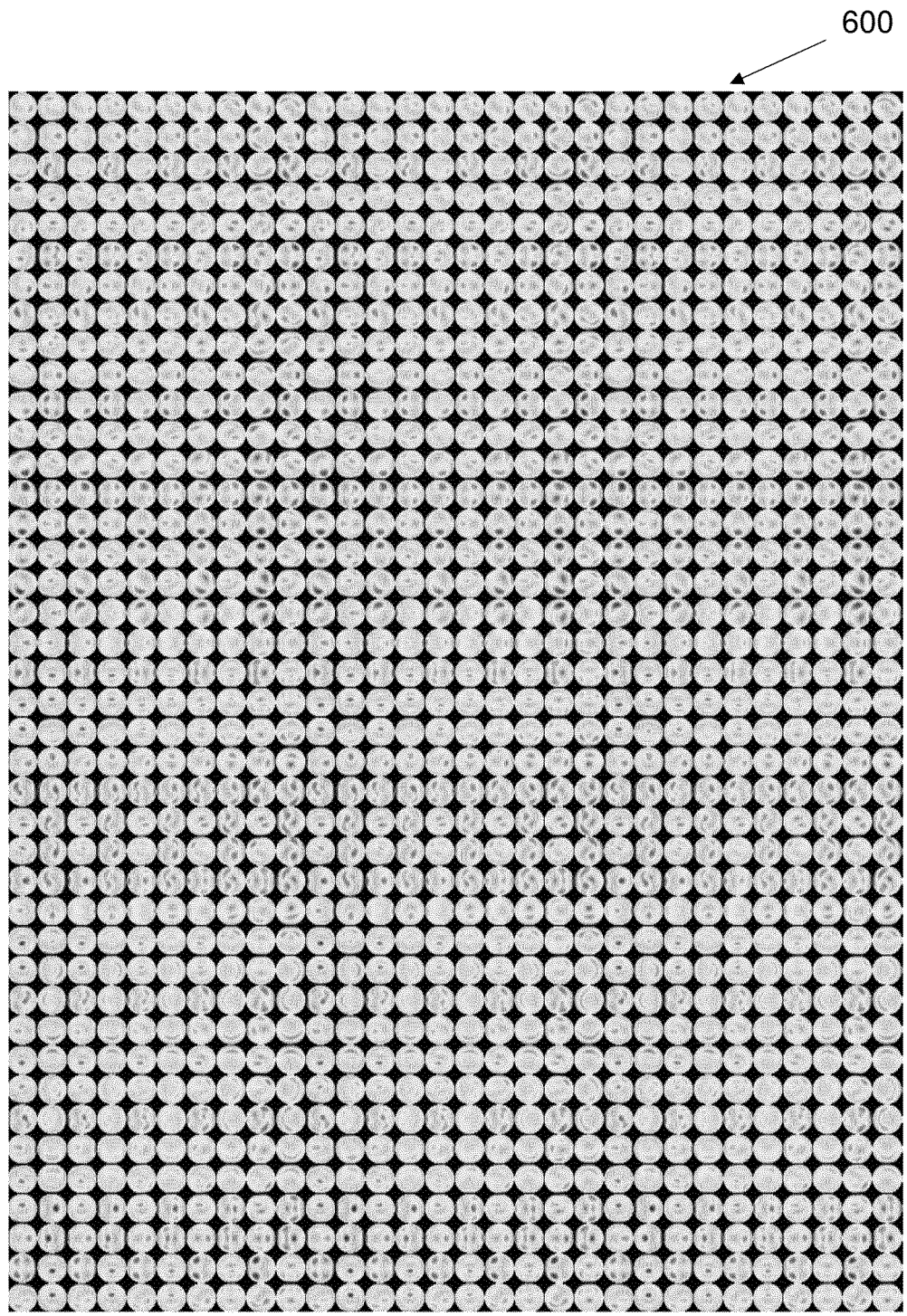
FIG. 6 illustrate a set of optical wavefront sensitivities, according to an embodiment.

In above equation $Z_n$ is the nth Zernike (e.g., Z2, Z3, Z4, Z5, Z6, Z7, Z8, Z9, etc.), and $EPE_k$ is k-th edge placement error corresponding to the n-th Zernike. An example of optical sensitivities 440 based on above equation is illustrated in FIG. 6. For example, if the simulation involves 41 clips, 2 edges of a feature, 5 focus levels, and 3 dose levels, then a total of 1230 optical sensitivity vectors are obtained. Furthermore, most imaging metrics that characterize the feature of a substrate scale linearly with optical sensitivities. For example, a lithographic metric may be computed as follows. Where sensitivity is determined based on the performance metric 405, as discussed above. In an embodiment, a litho metric may be computed based on a linear combination of sensitivity values (e.g., a differential of a performance metric) and the corresponding Zernike coefficient ($Z_k$).

$$\text{Litho metric} = \Sigma_k \text{Sensitivity}_k \cdot Z_k$$

The method 400, in process P46 involves identifying, based on the set of optical sensitivities 440, a set of components 460 including the optical characteristics that are dominant contributors in changing the value of the performance metric 405. In an embodiment, a component (interchangeably referred as an optical component) is the optical characteristic can be described via is a Zernike coefficient, so a set of components 460 including the optical characteristics can be described via a set of Zernike coefficients. For example, the set of components 460 (e.g., P1, P2, P3, etc.) includes relatively large contributions from Z8, Z11, Z15, Z20 and Z24, which combined explains most of the variation in the optical sensitivity values within the set of optical sensitivities 440 computed above. In other words, the set of components 460 (P1, P2, P3, etc. including relatively large contributions from Z8, Z11, Z15, Z20 and Z24) are the dominant contributors in changing the value of the performance metric 405. Thus, in an embodiment, only some of the optical characteristics (e.g., including contributions from Z5, Z8, etc.) of the set of components 460 may be tuned to improve the performance of the patterning process.

In an embodiment, the process P46 of the identifying the set of components 460 comprising the optical characteristics involves performing a principal component analysis on the set of optical sensitivities 440; and determining a linear combination of the optical characteristics that accounts for substantial variations within the set of optical sensitivities 440. Such linear combination is referred as a principal component of the set of optical sensitivities 440. For example, a principal component is a linear combination of d/d(Z8), d/d(Z11), d/d(Z15), d/d(Z20) and d/d(Z24). Thereby, modifying values of one or more of the (optical) characteristics (e.g., Z4, Z5, Z8) within the linear combination is sufficient to improve the performance of the patterning process. For example, the characteristic (e.g., Z8) that is the most significant contributor within a principal component (e.g., P1).

In an embodiment, a plurality of principal components (e.g., 3 or 4 components, P1-P4) are identified that together explain, for example, more than 90% of the variation in the optical sensitivities 440. In an embodiment, the principal components may be identified based on other criteria such as a covariance matrix that determined covariance based on principal components having same variables (e.g., Z8). Thus, the principal components reduce number of variables (e.g., optical parameters related to the optical aberrations) to be adjusted to a selected few that explains most of the variation, or fulfil other criteria such as co-variance used in PCA. For example, the 1230 optical sensitivities of FIG. 6 can be reduced to four principal components that explain 90% of the variation in the performance. The four example principal components are illustrated in FIGS. 7B, 7D, 7F, and 7H. Furthermore, within the principal components, a wavefront sensitivity map of a lower order Zernike that explains most variation is illustrated in FIGS. 7A, 7C, 7E, and 7F.

Figure 9:
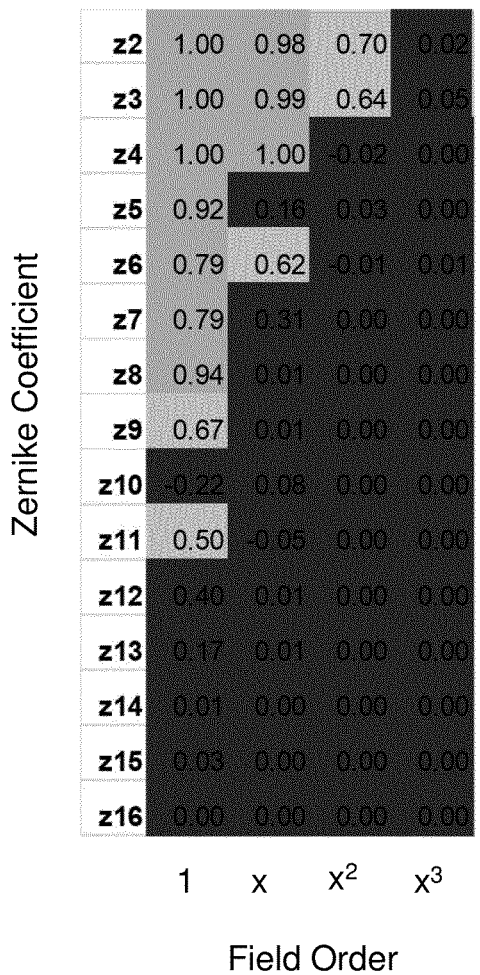
FIG. 9 is an example correction potential of a lithographic apparatus, according to an embodiment.

In an embodiment, a lower order Zernike coefficient such as Z2-Z9 (or optical characteristic in general) may be desired to be part of a dominant contribution, since such lower order Zernike can be modified via adjusting mechanism (e.g., connected to one or more mirrors) to adjust the performance of the patterning process. Thus, having any lower order Zernike in the principal component that can account for most variation may be particularly advantageous, since modifying for one component (e.g., Z8) will help offset impact of other higher order components (e.g., Z11, Z15, Z20, etc.) within the linear combination of the principal component. In an embodiment, ability to correct for higher order Zernike is highly desired since the patterning apparatus may be not have correction potential for higher order Zernikes. For example, impact of only lower order Zernikes are correctable (e.g., via adjustment mechanism of mirrors), as presented in example correction potential relationship in FIG. 9. For example, a constant Z2 indicates a translation of the substrate table in the x-direction, a constant Z3 indicates a translation of the substrate table in the y-direction, a constant Z4 is mainly indicative of a translation of the substrate table in the z-direction. Thus all can be compensated without any mirror movement. Similarly, Z5, Z7 and Z8 may be used for as offsets of the substrate table.

In an embodiment, a performance impact due to the higher order components may not be directly correctable. In other words, no tuning knobs or adjustment mechanism is available to correct for the impact of the higher order optical component (e.g., higher order optical aberrations). Thus, identifying one or more optical components (e.g., Z8, Z7, etc.) that can account for maximum variation, as well as compensate for effects of higher order non-correctable optical components is particular beneficial to improve performance with minimum tuning effort.

Figure 7A:
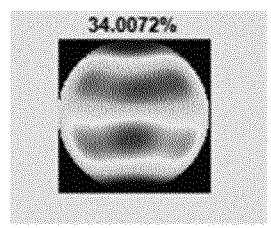
FIG. 7A illustrates a wavefront representation of a principle component comprising Zernike Z8, according to an embodiment.
Figure 7B:
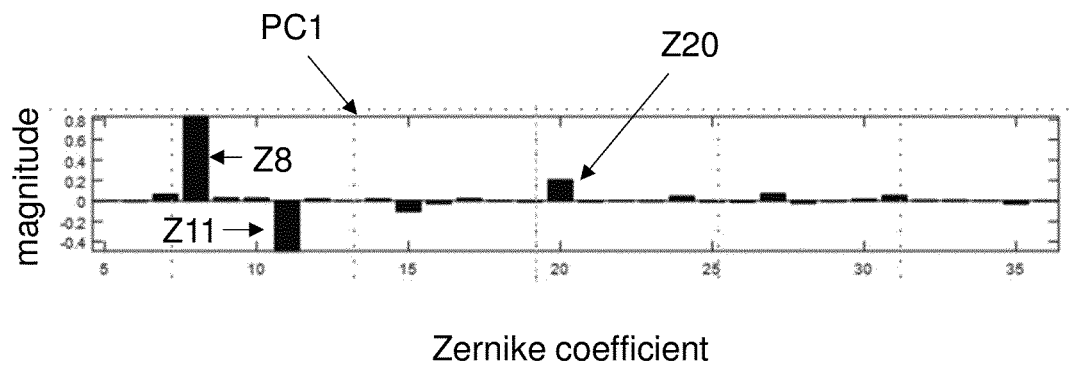
FIG. 7B illustrates a bar chart representation of a principal component comprising the Zernike Z8 of FIG. 7A, according to an embodiment.

In an embodiment, a first principal component PC1 is illustrated in FIG. 7B that includes the impact of a lower order Zernike coefficient Z8, which is the largest contributor and can thus be used as a correction knob. The first principal component PC1 comprises a linear combination of several Zernike coefficients having different magnitudes. For example, the first principal component PC1 comprises a linear combination: 0.8*Z8−0.4*Z11−0.1*Z15+0.2*Z20. In an embodiment, the first principal component PC1 corresponds to the performance metric EPEy which is measured along the y-direction (e.g., cut line CLy in FIG. 8A). In the specific case of FIG. 7, all holes of FIG. 5 were used. So PC1 relates to the EPEy placements of all holes from FIG. 5.

Thus, by tuning for Zernike Z8, the feature's behavior or movement along y-direction may be adjusted. FIG. 7A illustrates a wavefront sensitivity map of the first principle component P1 that can account for, e.g., approximately 34% of the variation in the optical sensitivities or the related performance metric (e.g., EPE). Upon modifying parameters (e.g., orientation of mirrors) one can minimize the part of the wavefront which is described by FIG. 7A (the first principle component), one can account for performance variations due to Z11, Z15 and Z20 (that have very low correctable potential or are non-correctable, according to FIG. 9) thereby improving the performance of the patterning process.

Figure 7C:
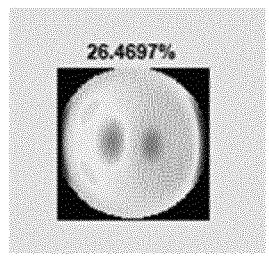
FIG. 7C illustrates a wavefront representation of a principle component comprising Zernike Z7, according to an embodiment.
Figure 7D:
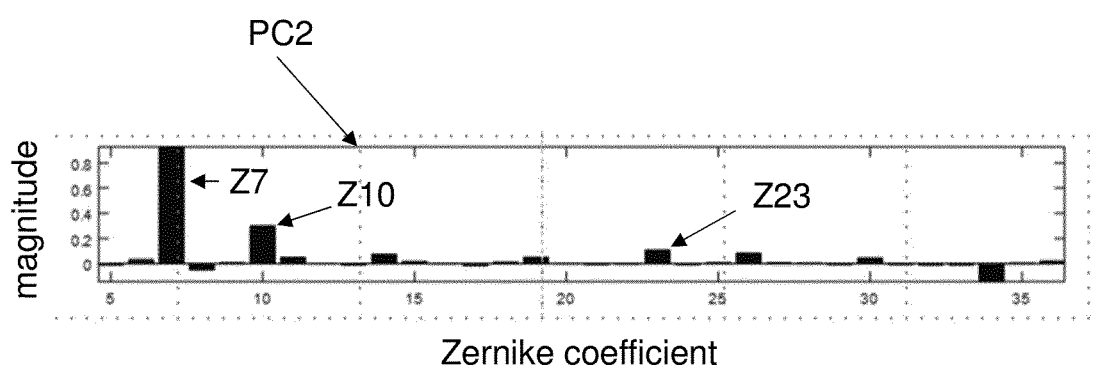
FIG. 7D illustrates a bar chart representing a principal component comprising the Zernike Z7 of FIG. 7C, according to an embodiment.
Figure 7E:
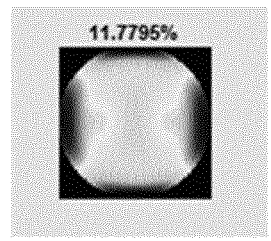
FIG. 7E illustrates a wavefront representation of a principle component comprising Zernike Z5, according to an embodiment.
Figure 7F:
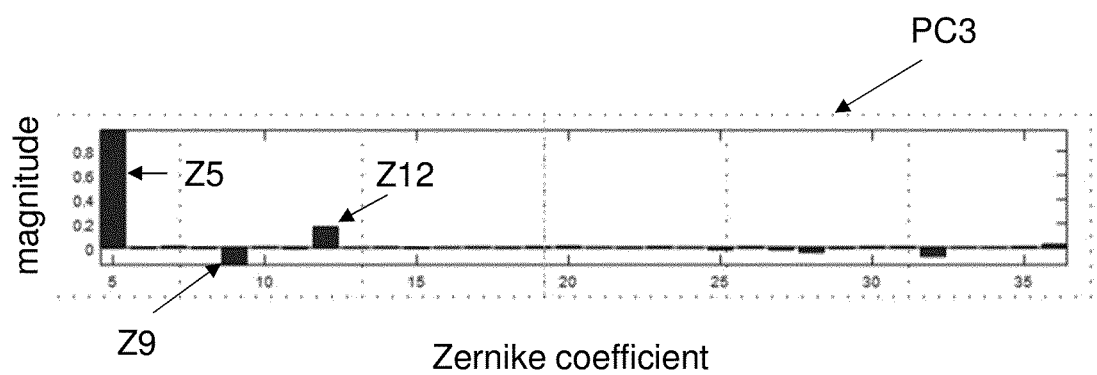
FIG. 7F illustrates a bar chart representing a principal component comprising the Zernike Z5 of FIG. 7E, according to an embodiment.
Figure 7G:
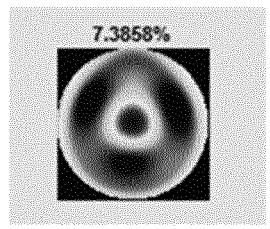
FIG. 7G illustrates a wavefront representation of a principle component comprising Zernike Z9, according to an embodiment.
Figure 7H:
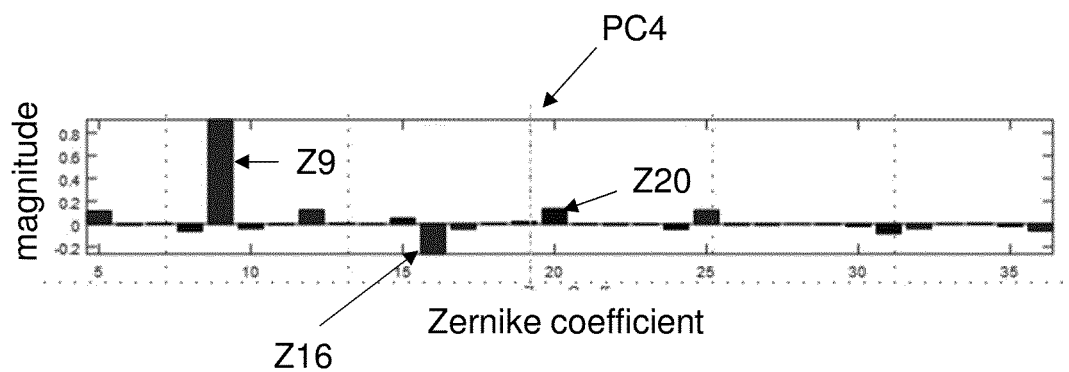
FIG. 7H illustrates a bar chart representing a principal component comprising the Zernike Z9 of FIG. 7G, according to an embodiment.

In an embodiment, a second principal component PC2 is illustrated in FIG. 7D that includes the impact of a lower order Zernike coefficient Z7, which is the largest contributor and can thus be used as a correction knob. The second principal component PC2 also comprises a linear combination of several Zernike coefficients having different magnitudes. For example, the second principal component PC2 comprises a linear combination: 0.9*Z7+0.4*Z10+0.1*Z14+0.2*Z23+ . . . . In an embodiment, the second principal component PC2 corresponds to the performance metric EPEx which is measured along the x-direction (e.g., cut line CLx in FIG. 8A). In the specific case of FIG. 7, all holes of FIG. 5 were used. So PC1 relates to the EPEx placements of all holes from FIG. 5.

Thus, by tuning for Zernike Z7, the feature's behavior or movement along x-direction may be adjusted. FIG. 7C illustrates a wavefront sensitivity map of the second principle component that can account for, e.g., approximately 26% of the variation in the optical sensitivities or the related performance metric (e.g., EPE). Upon modifying parameters (e.g., orientation of mirrors) one can minimize the part of the wavefront which is described by FIG. 7B (the second principle component), one can account for performance variations due to Z10, Z14, Z23, etc. (that have very low correctable potential or are non-correctable, according to FIG. 9) thereby improving the performance of the patterning process.

Similar to the first principal component PC1 and the second principal component PC2, a third principal component PC3 (in FIG. 7F) and a fourth principal component PC4 (in FIG. 7H) may be obtained. For example, the third principal component PC3 comprises a correctable Zernike coefficient Z5, which can be used to correct for impact due to other Zernike such as Z9 and Z12 (that have low to no correction potential) within the linear combination of PC3. Similarly, the fourth principal component PC4 comprises a correctable Zernike coefficient Z9, which can be used to correct for impact due to other non-correctable Zernike such as Z12, Z16 or other Zernike within the linear combination of PC4.

In sum, upon adjusting total lens (e.g., finding the optimal mirror positions and tilts), with the lack of any process knowledge, one minimizes the wavefront aberrations. In an embodiment, the wavefront aberrations are minimized by minimizing the sum of squared Zernike coefficients. This is equivalent in minimizing the sum of the squared wavefront, since the Zernike polynomials for an orthogonal and complete expansion. So going from the wavefront to the Zernike coefficients is a huge reduction of data without loosing the relevant content.

According to the methods of the present disclosure, the Zernike coefficients are mapped onto a new (orthogonal) basis i.e., principle components. In an embodiment, within the EPE space (all possible edge placements in different orientations and under different conditions (focus & dose), these principle components for an orthogonal and complete set. So going from the sensitivities of all features to only a few dominant components is a huge data reduction, without loss of much information. Combining both makes it possible to optimized the lens by minimizing the sum of squared principle components.

In an embodiment, the process P46 provides values of the identified components of the optical characteristic that correspond to a correctable Zernike coefficient, where the correctable Zernike coefficient is tunable via an adjustment mechanism of the patterning apparatus. In an embodiment, the linear combination includes a correctable Zernike coefficient and a non-correctable Zernike coefficient, where the non-correctable Zernike coefficient is not tunable via an adjustment mechanism of the patterning apparatus.

Once, the optical components that can account for most of the variation (e.g., more than 90% variation) in the performance value of the patterning process (e.g., related to a feature shape or size), the method 400, in process P48, further includes adjusting, via an adjusting mechanism, one or more mirrors of the patterning apparatus based on the set of identified optical components to improve a performance metric of the patterning process.

In an embodiment, the adjusting the one or more mirrors includes obtaining an optical correction potential of the patterning apparatus, where the correction potential is a relationship between Zernike coefficients and orders that are correctable or non-correctable via the adjusting mechanism of the patterning apparatus. Further, based on the correction potential, one or more mirrors of the optical system of the patterning apparatus are identified that associated with the correctable Zernike coefficients within the set of optical component. Once the mirrors are identified, adjusting process involves manipulating the identified mirrors to compensate for effects of the non-correctable Zernike coefficients such that the performance metric of the patterning process is improved.

The above method has several applications including source optimization, mask optimization, source mask optimization, or other process parameter optimization. For example, based on the set of optical sensitivities and a subset of correctable optical components (e.g., within PC1, PC2, PC3, PC4, etc.), an illumination mode, mask pattern, etc. may be modified. In an embodiment, the optimization process involves determining values of design variables (e.g., mask related, dose values, focus values, etc.) based on reducing of a cost function. An example of the optimization process is discussed in FIG. 10A and FIGS. 11-14 below.

Figure 10A:
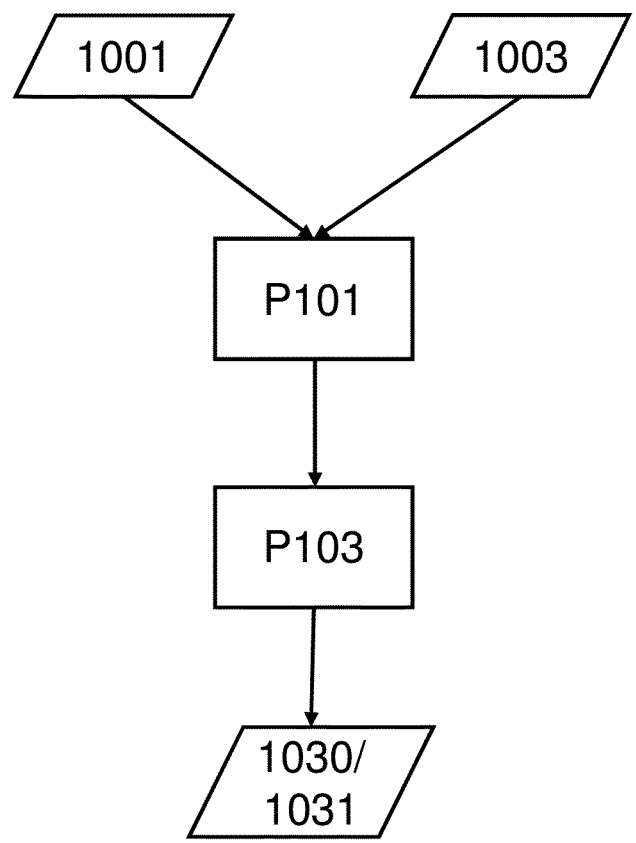
FIG. 10A is a flow chart of a method of an optimization based on optical sensitivity of a patterning process, according to an embodiment.

Referring to FIG. 10A, there is provided a method of an optimization based on optical sensitivity of a patterning process. The method, in process P101, involves obtaining (i) a set of optical sensitivities 1001, and (ii) a set of optical components 1003 (e.g., components 460 of FIG. 4 such as elements of a principal component) that are a dominant contributor to variations in the set of optical sensitivities The method, in process P103, involves determining, via a patterning process model, source pattern 1030 or mask pattern 1031 based on the set of optical components 1003 such that the performance metric is improved. In an embodiment, the determining the source pattern or the mask pattern is an iterative process. An iteration includes simulating the patterning process model with the set of values of the optical parameter and perturbing a parameter related to the source pattern and/or the mask pattern, determining the performance metric based on the simulation results, and determining values of the parameter related to the source pattern and/or the mask pattern such that the performance metric is improved. In an embodiment, the parameter of the source model is at least one of an illumination mode, and intensity. In an embodiment, the parameter of the mask model is at least one of: a placement location of an assist feature, a size of the feature, a shape of the assist feature, and/or a distance between two assist features.

In an embodiment, the performance metric is an edge placement error, and the improving of the performance metric comprises minimizing the edge placement error.

In an embodiment, the patterning process model is a source model, a mask model, an optics model, a resist model, and/or an etch model. An example of the simulation of the patterning process including one or more the aforementioned process models is discussed in FIG. 3, earlier.

In an embodiment, the method may be further extended to perform lens optimization, based on a lens optimization merit function. In an embodiment, the lens optimization merit function is based on the principal components (e.g., FIGS. 7A-7H) of the optical parameters that are identified, e.g., in the process P46. An example, lens optimization merit function (S) is give in equation below:

$$S = \Sigma_i \Sigma_k (w_k \cdot \Delta Z_{k,i})^2 + \Sigma_i \Sigma_m w_m \cdot (\Sigma_k PC_{m,k} \cdot \Delta Z_{k,i})^2$$

Figure 10B:
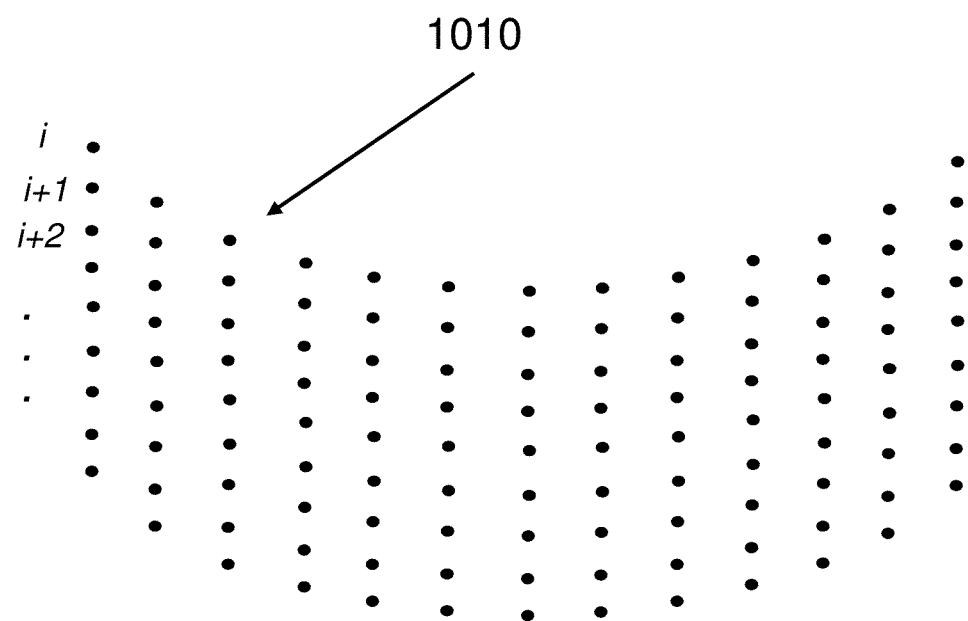
FIG. 10B illustrates field points along a slit of a projection optics box, according to an embodiment.

In the above equation, a $1^{st}$ part of the equation is a weight based Zernike term, and a $2^{nd}$ part is an additional term comprising the principal components (e.g., as discussed with respect to FIG. 4 and FIGS. 7B, 7D, 7F, 7H). Furthermore, i runs over various field points 1010, (see FIG. 10B) of a slit, k runs over the different Zernike coefficients (2 till 25, 36, 49, 64 or 100), AZ corresponds to the difference between a measured Zernike coefficient and a lens model induced Zernike coefficient (e.g., induced for simulation purposes), $PC_{m,n}$ is a transformation of the $m^{th}$ principle component to Zernike n, and $w_m$ is the associated principle component weight.

In an embodiment, the method may further include printing a pattern on the substrate using the tunable characteristic (e.g., lower order Zernike coefficients within a principal component). Further, measurement data of the printed pattern may be obtained and the performance of the patterning apparatus (e.g., a scanner) may be verified against a reference performance based on the measurement data.

The method, according to the present disclosure, has several advantages. For example, natural variation of non-adjustable parameters can cause large performance variation with respect to a desired specification. Such variation may be reduced by adjusting only selected optical parameters according to the present disclosure. When the cause of performance mismatch is a non-tunable optical characteristic, a replacement of hardware related to the non-tunable characteristic cause may be required. However, according to the present disclosure, if a non-tunable characteristic exists, tuning a single or multiple scanner knobs to compensate for the non-tunable characteristic can be proposed. Accordingly, in an embodiment, a non-tunable characteristic (e.g. higher order Zernike coefficients) can be corrected for by a tuning a tunable characteristic (e.g., lower order Zernike coefficients within a principal component) of the scanner.

As discussed in method 400, the identified optical characteristic may be employed in optimization of patterning process or adjusting parameters of the patterning process. As an example, OPC addresses the fact that the final size and placement of an image of the design layout projected on the substrate will not be identical to, or simply depend only on the size and placement of the design layout on the patterning device. It is noted that the terms "mask", "reticle", "patterning device" are utilized interchangeably herein. Also, person skilled in the art will recognize that, especially in the context of lithography simulation/optimization, the term "mask"/"patterning device" and "design layout" can be used interchangeably, as in lithography simulation/optimization, a physical patterning device is not necessarily used but a design layout can be used to represent a physical patterning device. For the small feature sizes and high feature densities present on some design layout, the position of a particular edge of a given feature will be influenced to a certain extent by the presence or absence of other adjacent features. These proximity effects arise from minute amounts of radiation coupled from one feature to another and/or non-geometrical optical effects such as diffraction and interference. Similarly, proximity effects may arise from diffusion and other chemical effects during post-exposure bake (PEB), resist development, and etching that generally follow lithography.

In order to ensure that the projected image of the design layout is in accordance with requirements of a given target circuit design, proximity effects need to be predicted and compensated for, using sophisticated numerical models, corrections or pre-distortions of the design layout. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design almost every feature of the design layout has some modification in order to achieve high fidelity of the projected image to the target design. These modifications may include shifting or biasing of edge positions or line widths as well as application of "assist" features that are intended to assist projection of other features.

Application of model-based OPC to a target design involves good process models and considerable computational resources, given the many millions of features typically present in a chip design. However, applying OPC is generally not an "exact science", but an empirical, iterative process that does not always compensate for all possible proximity effect. Therefore, effect of OPC, e.g., design layouts after application of OPC and any other RET, need to be verified by design inspection, i.e. intensive full-chip simulation using calibrated numerical process models, in order to minimize the possibility of design flaws being built into the patterning device pattern. This is driven by the enormous cost of making high-end patterning devices, which run in the multi-million-dollar range, as well as by the impact on turn-around time by reworking or repairing actual patterning devices once they have been manufactured.

Both OPC and full-chip RET verification may be based on numerical modeling systems and methods as described, for example in, U.S. patent application Ser. No. 10/815,573 and an article titled "Optimized Hardware and Software For Fast, Full Chip Simulation", by Y. Cao et al., Proc. SPIE, Vol. 5754, 405 (2005).

One RET is related to adjustment of the global bias of the design layout. The global bias is the difference between the patterns in the design layout and the patterns intended to print on the substrate. For example, a circular pattern of 25 nm diameter may be printed on the substrate by a 50 nm diameter pattern in the design layout or by a 20 nm diameter pattern in the design layout but with high dose.

In addition to optimization to design layouts or patterning devices (e.g., OPC), the illumination source can also be optimized, either jointly with patterning device optimization or separately, in an effort to improve the overall lithography fidelity. The terms "illumination source" and "source" are used interchangeably in this document. Since the 1990s, many off-axis illumination sources, such as annular, quadrupole, and dipole, have been introduced, and have provided more freedom for OPC design, thereby improving the imaging results, As is known, off-axis illumination is a proven way to resolve fine structures (i.e., target features) contained in the patterning device. However, when compared to a traditional illumination source, an off-axis illumination source usually provides less radiation intensity for the aerial image (AI). Thus, it becomes desirable to attempt to optimize the illumination source to achieve the optimal balance between finer resolution and reduced radiation intensity.

Numerous illumination source optimization approaches can be found, for example, in an article by Rosenbluth et al., titled "Optimum Mask and Source Patterns to Print A Given Shape", Journal of Microlithography, Microfabrication, Microsystems 1(1), pp. 13-20, (2002). The source is partitioned into several regions, each of which corresponds to a certain region of the pupil spectrum. Then, the source distribution is assumed to be uniform in each source region and the brightness of each region is optimized for process window. However, such an assumption that the source distribution is uniform in each source region is not always valid, and as a result the effectiveness of this approach suffers. In another example set forth in an article by Granik, titled "Source Optimization for Image Fidelity and Throughput", Journal of Microlithography, Microfabrication, Microsystems 3(4), pp. 509-522, (2004), several existing source optimization approaches are overviewed and a method based on illuminator pixels is proposed that converts the source optimization problem into a series of non-negative least square optimizations. Though these methods have demonstrated some successes, they typically require multiple complicated iterations to converge. In addition, it may be difficult to determine the appropriate/optimal values for some extra parameters, such as y in Granik's method, which dictates the trade-off between optimizing the source for substrate image fidelity and the smoothness requirement of the source.

For low $k_1$ photolithography, optimization of both the source and patterning device is useful to ensure a viable process window for projection of critical circuit patterns. Some algorithms (e.g. Socha et. al. Proc. SPIE vol. 5853, 2005, p. 180) discretize illumination into independent source points and mask into diffraction orders in the spatial frequency domain, and separately formulate a cost function (which is defined as a function of selected design variables) based on process window metrics such as exposure latitude which could be predicted by optical imaging models from source point intensities and patterning device diffraction orders. The term "design variables" as used herein comprises a set of parameters of a lithographic projection apparatus or a lithographic process, for example, parameters a user of the lithographic projection apparatus can adjust, or image characteristics a user can adjust by adjusting those parameters. It should be appreciated that any characteristics of a lithographic projection process, including those of the source, the patterning device, the projection optics, and/or resist characteristics can be among the design variables in the optimization. The cost function is often a non-linear function of the design variables. Then standard optimization techniques are used to minimize the cost function.

Relatedly, the pressure of ever decreasing design rules have driven semiconductor chipmakers to move deeper into the low $k_1$ lithography era with existing 193 nm ArF lithography. Lithography towards lower $k_1$ puts heavy demands on RET, exposure tools, and the need for litho-friendly design. 1.35 ArF hyper numerical aperture (NA) exposure tools may be used in the future. To help ensure that circuit design can be produced on to the substrate with workable process window, source-patterning device optimization (referred to herein as source-mask optimization or SMO) is becoming a significant RET for 2×nm node.

A source and patterning device (design layout) optimization method and system that allows for simultaneous optimization of the source and patterning device using a cost function without constraints and within a practicable amount of time is described in a commonly assigned International Patent Application No. PCT/US2009/065359, filed on Nov. 20, 2009, and published as WO2010/059954, titled "Fast Freeform Source and Mask Co-Optimization Method", which is hereby incorporated by reference in its entirety.

Another source and mask optimization method and system that involves optimizing the source by adjusting pixels of the source is described in a commonly assigned U.S. patent application Ser. No. 12/813,456, filed on Jun. 10, 2010, and published as U.S. Patent Application Publication No. 2010/0315614, titled "Source-Mask Optimization in Lithographic Apparatus", which is hereby incorporated by reference in its entirety.

In a lithographic projection apparatus, as an example, a cost function is expressed as $$CF(z_1, z_2, \ldots, z_N) = \sum_{p=1}^{P} w_p f_p^2(z_1, z_2, \ldots, z_N) \quad \text{(Eq. 1)}$$

wherein $(z_1, z_2, \ldots, z_N)$ are N design variables or values thereof. $f_p(z_1, z_2, \ldots, z_N)$ can be a function of the design variables $(z_1, z_2, \ldots, z_N)$ such as a difference between an actual value and an intended value of a characteristic at an evaluation point for a set of values of the design variables of $(z_1, z_2, \ldots, z_N)$. $w_p$ is a weight constant associated with $f_p(z_1, z_2, \ldots, z_N)$. An evaluation point or pattern more critical than others can be assigned a higher $w_p$ value. Patterns and/or evaluation points with larger number of occurrences may be assigned a higher $w_p$ value, too. Examples of the evaluation points can be any physical point or pattern on the substrate, any point on a virtual design layout, or resist image, or aerial image, or a combination thereof. $f_p(z_1, z_2, \ldots, z_N)$ can also be a function of one or more identified optical characteristics such as the LWR, which are functions of the design variables $(z_1, z_2, \ldots, z_N)$. The cost function may represent any suitable characteristics of the lithographic projection apparatus or the substrate, for instance, failure rate of a feature, an identified optical characteristic, focus, CD, image shift, image distortion, image rotation, stochastic effects, throughput, CDU, or a combination thereof. CDU is local CD variation (e.g., three times of the standard deviation of the local CD distribution). CDU may be interchangeably referred to as LCDU. In one embodiment, the cost function represents (i.e., is a function of) CDU, throughput, and the stochastic effects. In one embodiment, the cost function represents (i.e., is a function of) EPE, throughput, and the stochastic effects. In one embodiment, the design variables $(z_1, z_2, \ldots, z_N)$ comprise dose, global bias of the patterning device, shape of illumination from the source, or a combination thereof. Since it is the resist image that often dictates the circuit pattern on a substrate, the cost function often includes functions that represent some characteristics of the resist image. For example, $f_p(z_1, z_2, \ldots, z_N)$ of such an evaluation point can be simply a distance between a point in the resist image to an intended position of that point (i.e., edge placement error $EPE_p(z_1, z_2, \ldots, z_N)$). The design variables can be any adjustable parameters such as adjustable parameters of the source, the patterning device, the projection optics, dose, focus, etc. The projection optics may include components collectively called as "wavefront manipulator" that can be used to adjust shapes of a wavefront and intensity distribution and/or phase shift of the irradiation beam. The projection optics preferably can adjust a wavefront and intensity distribution at any location along an optical path of the lithographic projection apparatus, such as before the patterning device, near a pupil plane, near an image plane, near a focal plane. The projection optics can be used to correct or compensate for certain distortions of the wavefront and intensity distribution caused by, for example, the source, the patterning device, temperature variation in the lithographic projection apparatus, thermal expansion of components of the lithographic projection apparatus. Adjusting the wavefront and intensity distribution can change values of the evaluation points and the cost function. Such changes can be simulated from a model or actually measured. Of course, CF $(z_1, z_2, \ldots, z_N)$ is not limited the form in Eq. 1. CF $(z_1, z_2, \ldots, z_N)$ can be in any other suitable form.

It should be noted that the normal weighted root mean square (RMS) of $f_p(z_1, z_2, \ldots, z_N)$ is defined as $$\sqrt{\frac{1}{P}\sum_{p=1}^{P} w_p f_p^2(z_1, z_2, \ldots, z_N)},$$

therefore, minimizing the weighted RMS of $f_p(z_1, z_2, \ldots, z_N)$ is equivalent to minimizing the cost function $$CF(z_1, z_2, \ldots, z_N) = \sum_{p=1}^{P} w_p f_p^2(z_1, z_2, \ldots, z_N),$$

defined in Eq. 1. Thus the weighted RMS of $f_p(z_1, z_2, \ldots, z_N)$ and Eq. 1 may be utilized interchangeably for notational simplicity herein.

Further, if considering maximizing the PW (Process Window), one can consider the same physical location from different PW conditions as different evaluation points in the cost function in (Eq. 1). For example, if considering N PW conditions, then one can categorize the evaluation points according to their PW conditions and write the cost functions as:

$$CF(z_1, z_2, \ldots, z_N) = \qquad (\text{Eq. 1'})$$

$$\sum_{p=1}^{P} w_p f_p^2(z_1, z_2, \ldots, z_N) = \sum_{u=1}^{U} \sum_{p_u=1}^{P_u} w_{p_u} f_{p_u}^2(z_1, z_2, \ldots, z)$$

Where $f_{p_u}(z_1, z_2, \ldots, z_N)$ is the value of $f_p(z_1, z_2, \ldots, z_N)$ under the u-th PW condition u=1, ..., U. When $f_p(z_1, z_2, \ldots, z_N)$ is the EPE, then minimizing the above cost function is equivalent to minimizing the edge shift under various PW conditions, thus this leads to maximizing the PW. In particular, if the PW also consists of different mask bias, then minimizing the above cost function also includes the minimization of MEEF (Mask Error Enhancement Factor), which is defined as the ratio between the substrate EPE and the induced mask edge bias.

The design variables may have constraints, which can be expressed as $(z_1, z_2, \ldots, z_N) \in Z$, where Z is a set of possible values of the design variables. One possible constraint on the design variables may be imposed by a desired throughput of the lithographic projection apparatus. The desired throughput may limit the dose and thus has implications for the stochastic effects (e.g., imposing a lower bound on the stochastic effects). Higher throughput generally leads to lower dose, shorter longer exposure time and greater stochastic effects. Consideration of substrate throughput and minimization of the stochastic effects may constrain the possible values of the design variables because the stochastic effects are function of the design variables. Without such a constraint imposed by the desired throughput, the optimization may yield a set of values of the design variables that are unrealistic. For example, if the dose is among the design variables, without such a constraint, the optimization may yield a dose value that makes the throughput economically impossible. However, the usefulness of constraints should not be interpreted as a necessity. The throughput may be affected by the failure rate based adjustment to parameters of the patterning process. It is desirable to have lower failure rate of the feature while maintaining a high throughput. Throughput may also be affected by the resist chemistry. Slower resist (e.g., a resist that requires higher amount of light to be properly exposed) leads to lower throughput. Thus, based on the optimization process involving failure rate of a feature due to resist chemistry or fluctuations, and dose requirements for higher throughput, appropriate parameters of the patterning process may be determined.

The optimization process therefore is to find a set of values of the design variables, under the constraints $(z_1, z_2, \ldots, z_N) \in Z$, that minimize the cost function, i.e., to find $$(\tilde{z}_1, \tilde{z}_2, \ldots, \tilde{z}_N) = \operatorname*{argmin}_{(z_1, z_2, \ldots, z_N) \in Z} CF(z_1, z_2, \ldots, z_N) = \qquad (\text{Eq. 2})$$

$$\operatorname*{argmin}_{(z_1, z_2, \ldots, z_N) \in Z} \sum_{p=1}^{P} w_p f_p^2(z_1, z_2, \ldots, z_N)$$

Figure 11:
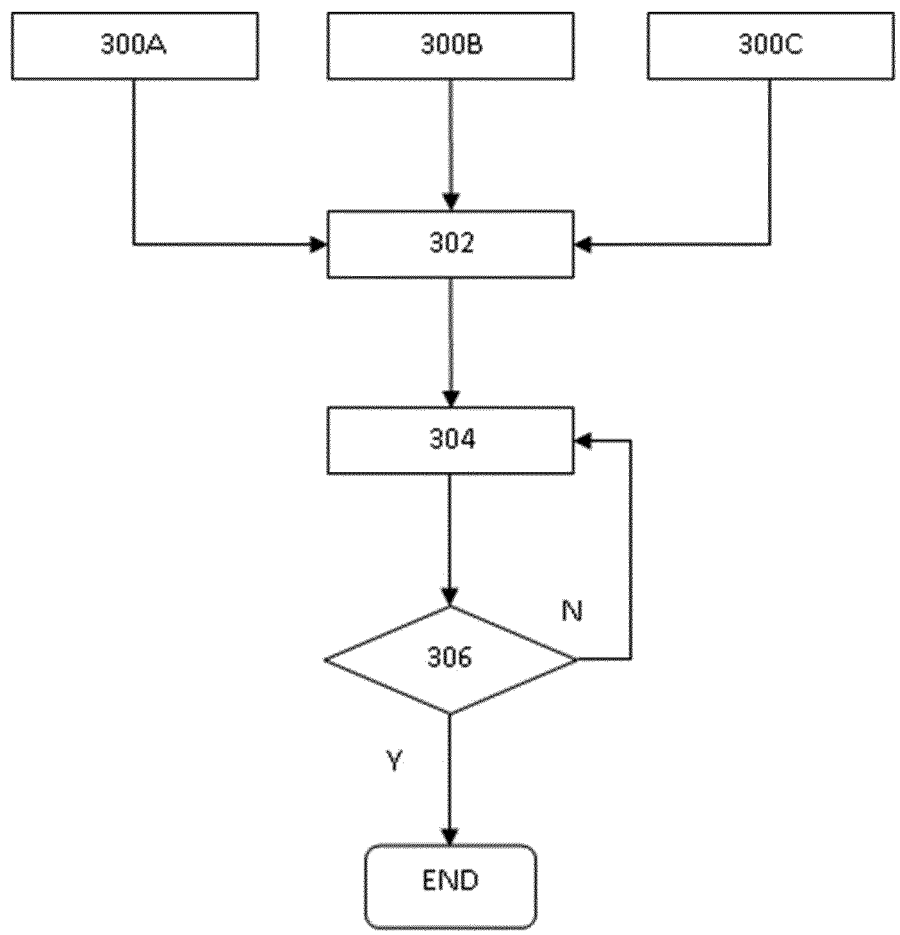
FIG. 11 is a flow diagram illustrating aspects of an example methodology of joint optimization, according to an embodiment.

A general method of optimizing the lithography projection apparatus, according to an embodiment, is illustrated in FIG. 11. This method comprises a step 302 of defining a multi-variable cost function of a plurality of design variables. The design variables may comprise any suitable combination selected from characteristics of the illumination source (300A) (e.g., pupil fill ratio, namely percentage of radiation of the source that passes through a pupil or aperture), characteristics of the projection optics (300B) and characteristics of the design layout (300C). For example, the design variables may include characteristics of the illumination source (300A) and characteristics of the design layout (300C) (e.g., global bias) but not characteristics of the projection optics (300B), which leads to an SMO. Alternatively, the design variables may include characteristics of the illumination source (300A), characteristics of the projection optics (300B) and characteristics of the design layout (300C), which leads to a source-mask-lens optimization (SMLO). In step 304, the design variables are simultaneously adjusted so that the cost function is moved towards convergence. In step 306, it is determined whether a predefined termination condition is satisfied. The predetermined termination condition may include various possibilities, i.e. the cost function may be minimized or maximized, as required by the numerical technique used, the value of the cost function has been equal to a threshold value or has crossed the threshold value, the value of the cost function has reached within a preset error limit, or a preset number of iteration is reached. If either of the conditions in step 306 is satisfied, the method ends. If none of the conditions in step 306 is satisfied, the step 304 and 306 are iteratively repeated until a desired result is obtained. The optimization does not necessarily lead to a single set of values for the design variables because there may be physical restraints caused by factors such as the failure rates, the pupil fill factor, the resist chemistry, the throughput, etc. The optimization may provide multiple sets of values for the design variables and associated performance characteristics (e.g., the throughput) and allows a user of the lithographic apparatus to pick one or more sets.

In a lithographic projection apparatus, the source, patterning device and projection optics can be optimized alternatively (referred to as Alternative Optimization) or optimized simultaneously (referred to as Simultaneous Optimization). The terms "simultaneous", "simultaneously", "joint" and "jointly" as used herein mean that the design variables of the characteristics of the source, patterning device, projection optics and/or any other design variables, are allowed to change at the same time. The term "alternative" and "alternatively" as used herein mean that not all of the design variables are allowed to change at the same time.

Figure 12:
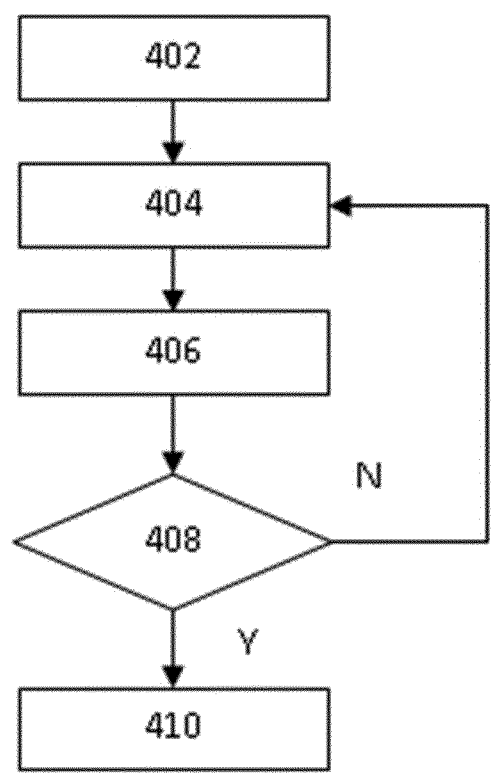
FIG. 12 shows an embodiment of another optimization method, according to an embodiment.

In FIG. 11, the optimization of all the design variables is executed simultaneously. Such flow may be called the simultaneous flow or co-optimization flow. Alternatively, the optimization of all the design variables is executed alternatively, as illustrated in FIG. 12. In this flow, in each step, some design variables are fixed while the other design variables are optimized to minimize the cost function; then in the next step, a different set of variables are fixed while the others are optimized to minimize the cost function. These steps are executed alternatively until convergence or certain terminating conditions are met.

As shown in the non-limiting example flowchart of FIG. 12, first, a design layout (step 402) is obtained, then a step of source optimization is executed in step 404, where all the design variables of the illumination source are optimized (SO) to minimize the cost function while all the other design variables are fixed. Then in the next step 406, a mask optimization (MO) is performed, where all the design variables of the patterning device are optimized to minimize the cost function while all the other design variables are fixed. These two steps are executed alternatively, until certain terminating conditions are met in step 408. Various termination conditions can be used, such as, the value of the cost function becomes equal to a threshold value, the value of the cost function crosses the threshold value, the value of the cost function reaches within a preset error limit, or a preset number of iteration is reached, etc. Note that SO-MO-Alternative-Optimization is used as an example for the alternative flow. The alternative flow can take many different forms, such as SO-LO-MO-Alternative-Optimization, where SO, LO (Lens Optimization) is executed, and MO alternatively and iteratively; or first SMO can be executed once, then execute LO and MO alternatively and iteratively; and so on. Finally, the output of the optimization result is obtained in step 410, and the process stops.

The pattern selection algorithm, as discussed before, may be integrated with the simultaneous or alternative optimization. For example, when an alternative optimization is adopted, first a full-chip SO can be performed, the 'hot spots' and/or 'warm spots' are identified, then an MO is performed. In view of the present disclosure numerous permutations and combinations of sub-optimizations are possible in order to achieve the desired optimization results.

Figure 13A:
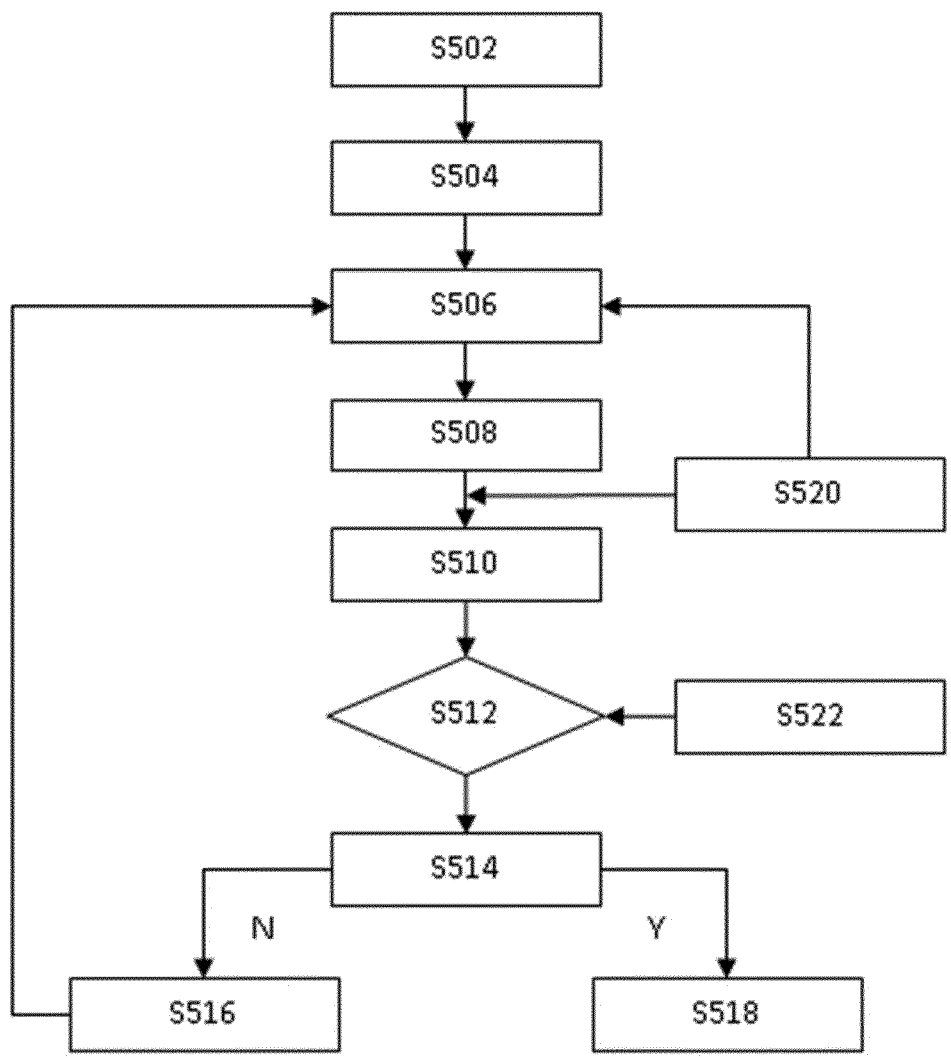
FIGS. 13A, 13B and 14 show example flowcharts of various optimization processes, according to an embodiment.

FIG. 13A shows one exemplary method of optimization, where a cost function is minimized In step S502, initial values of design variables are obtained, including their tuning ranges, if any. In step S504, the multi-variable cost function is set up. In step S506, the cost function is expanded within a small enough neighborhood around the starting point value of the design variables for the first iterative step (i=0). In step S508, standard multi-variable optimization techniques are applied to minimize the cost function. Note that the optimization problem can apply constraints, such as tuning ranges, during the optimization process in S508 or at a later stage in the optimization process. Step S520 indicates that each iteration is done for the given test patterns (also known as "gauges") for the identified evaluation points that have been selected to optimize the lithographic process. In step S510, a lithographic response is predicted. In step S512, the result of step S510 is compared with a desired or ideal lithographic response value obtained in step S522. If the termination condition is satisfied in step S514, i.e. the optimization generates a lithographic response value sufficiently close to the desired value, and then the final value of the design variables is outputted in step S518. The output step may also include outputting other functions using the final values of the design variables, such as outputting a wavefront aberration-adjusted map at the pupil plane (or other planes), an optimized source map, and optimized design layout etc. If the termination condition is not satisfied, then in step S516, the values of the design variables is updated with the result of the i-th iteration, and the process goes back to step S506. The process of FIG. 13A is elaborated in details below.

In an exemplary optimization process, no relationship between the design variables $(z_1, z_2, \ldots, z_N)$ and $f_p(z_1, z_2, \ldots, z_N)$ is assumed or approximated, except that $f_p(z_1, z_2, \ldots, z_N)$ is sufficiently smooth (e.g. first order derivatives $$\frac{\partial f_p(z_1, z_2, \ldots, z_N)}{\partial z_n}, (n = 1, 2, \ldots N)$$

exist), which is generally valid in a lithographic projection apparatus. An algorithm, such as the Gauss-Newton algorithm, the Levenberg-Marquardt algorithm, the gradient descent algorithm, simulated annealing, the genetic algorithm, can be applied to find $(\tilde{z}_1, \tilde{z}_2, \ldots, \tilde{z}_N)$.

Here, the Gauss-Newton algorithm is used as an example. The Gauss-Newton algorithm is an iterative method applicable to a general non-linear multi-variable optimization problem. In the i-th iteration wherein the design variables $(z_1, z_2, \ldots, z_N)$ take values of $(z_{1i}, z_{2i}, \ldots, z_{Ni})$ the Gauss-Newton algorithm linearizes $f_p(z_1, z_2, \ldots, z_N)$ in the vicinity of $(z_{1i}, z_{2i}, \ldots, z_{Ni})$, and then calculates values $(z_{1(i+1)}, z_{2(i+1)}, \ldots, z_{N(i+1)})$ in the vicinity of $(z_{1i}, z_{2i}, \ldots, z_{Ni})$ that give a minimum of CF $(z_1, z_2, \ldots, z_N)$. The design variables $(z_1, z_2, \ldots, z_N)$ take the values of $(z_{1(i+1)}, z_{2(i+1)}, \ldots, z_{N(i+1)})$ in the (i+1)-th iteration. This iteration continues until convergence (i.e. CF $(z_1, z_2, \ldots, z_N)$ does not reduce any further) or a preset number of iterations is reached.

Specifically, in the i-th iteration, in the vicinity of $(z_{1i}, z_{2i}, \ldots, z_{Ni})$, $$f_p(z_1, z_2, \ldots, z_N) \approx f_p(z_{1i}, z_{2i}, \ldots, z_{Ni}) + \sum_{n=1}^{N} \frac{\partial f_p(z_1, z_2, \ldots, z_N)}{\partial z_n}\bigg|_{z_1=z_{1i}, z_2=z_{2i}, \ldots, z_N=z_{Ni}} (z_n - z_{ni}) \quad \text{(Eq. 3)}$$

Under the approximation of Eq. 3, the cost function becomes:

$$CF(z_1, z_2, \ldots, z_N) = \sum_{p=1}^{P} w_p f_p^2(z_1, z_2, \ldots, z_N) = \sum_{p=1}^{P} w_p \left( f_p(z_{1i}, z_{2i}, \ldots, z_{Ni}) + \sum_{n=1}^{N} \frac{\partial f_p(z_1, z_2, \ldots, z_N)}{\partial z_n}\bigg|_{z_1=z_{1i}, z_2=z_{2i}, \ldots, z_N=z_{Ni}} (z_n - z_{ni}) \right) \quad \text{(Eq. 4)}$$

which is a quadratic function of the design variables ($z_1$, $z_2$, ..., $z_N$). Every term is constant except the design variables ($z_1$, $z_2$, ..., $z_N$).

If the design variables ($z_1$, $z_2$, ..., $z_N$) are not under any constraints, ($z_{1(i+1)}$, $z_{2(i+1)}$, ..., $z_{N(i+1)}$) can be derived by solving by N linear equations:

$$\frac{\partial CF(z_1, z_2, \ldots, z_N)}{\partial z_n} = 0,$$

wherein n=1, 2, ... N.

If the design variables ($z_1$, $z_2$, ..., $z_N$) are under the constraints in the form of J inequalities (e.g. tuning ranges of ($z_1$, $z_2$, ..., $z_N$))

$$\sum_{n=1}^{N} A_{nj} z_n \leq B_j,$$

for j=1, 2, ... J; and K equalities (e.g. interdependence between the design variables)

$$\sum_{n=1}^{N} C_{nk} z_n = D_k,$$

for k=1, 2, ... K; the optimization process becomes a classic quadratic programming problem, wherein $A_{nj}$, $B_j$, $C_{nk}$, $D_k$ are constants. Additional constraints can be imposed for each iteration. For example, a "damping factor" $\Delta_D$ can be introduced to limit the difference between ($z_{1(i+1)}$, $z_{2(i+1)}$, ..., $z_{N(i+1)}$) and ($z_{1i}$, $z_{2i}$, ..., $z_{Ni}$), so that the approximation of Eq. 3 holds. Such constraints can be expressed as $z_{ni} - \Delta_D \leq z_n \leq z_{ni} + \Delta_D$. ($z_{1(i+1)}$, $z_{2(i+1)}$, ..., $z_{N(i+1)}$) can be derived using, for example, methods described in Numerical Optimization (2$^{nd}$ ed.) by Jorge Nocedal and Stephen J. Wright (Berlin N.Y.: Vandenberghe. Cambridge University Press).

Instead of minimizing the RMS of $f_p$ ($z_1$, $z_2$, ..., $z_N$), the optimization process can minimize magnitude of the largest deviation (the worst defect) among the evaluation points to their intended values. In this approach, the cost function can alternatively be expressed as $$CF(z_1, z_2, \ldots, z_N) = \max_{1 \leq p \leq P} \frac{f_p(z_1, z_2, \ldots, z_N)}{CL_p}, \quad \text{(Eq. 5)}$$

wherein $CL_p$ is the maximum allowed value for $f_p$ ($z_1$, $z_2$, ..., $z_N$). This cost function represents the worst defect among the evaluation points. Optimization using this cost function minimizes magnitude of the worst defect. An iterative greedy algorithm can be used for this optimization.

The cost function of Eq. 5 can be approximated as:

$$CF(z_1, z_2, \ldots, z_N) = \sum_{p=1}^{P} \left( \frac{f_p(z_1, z_2, \ldots, z_N)}{CL_p} \right)^q, \quad \text{(Eq. 6)}$$

wherein q is an even positive integer such as at least 4, preferably at least 10. Eq. 6 mimics the behavior of Eq. 5, while allowing the optimization to be executed analytically and accelerated by using methods such as the deepest descent method, the conjugate gradient method, etc.

Minimizing the worst defect size can also be combined with linearizing of $f_p$ ($z_1$, $z_2$, ..., $z_N$). Specifically, $f_p$ ($z_1$, $z_2$, ..., $z_N$) is approximated as in Eq. 3. Then the constraints on worst defect size are written as inequalities $E_{Lp} \leq f_p$ ($z_1$, $z_2$, ..., $z_N$) $\leq E_{Up}$, wherein $E_{Lp}$ and $E_{Up}$ are two constants specifying the minimum and maximum allowed deviation for the $f_p$ ($z_1$, $z_2$, ..., $z_N$). Plugging Eq. 3 in, these constraints are transformed to, for p=1, ... P, $$\sum_{n=1}^{N} \left. \frac{\partial f_p(z_1, z_2, \ldots, z_N)}{\partial z_n} \right|_{z_1=z_{1i}, z_2=z_{2i}, \ldots, z_N=z_{Ni}} z_n \leq \quad \text{(Eq. 6')}$$

$$E_{Up} + \sum_{n=1}^{N} \left. \frac{\partial f_p(z_1, z_2, \ldots, z_N)}{\partial z_n} \right|_{z_1=z_{1i}, z_2=z_{2i}, \ldots, z_N=z_{Ni}}$$

$$z_{ni} - f_p(z_{1i}, z_{2i}, \ldots, z_{Ni}) \text{ and}$$

$$-\sum_{n=1}^{N} \left. \frac{\partial f_p(z_1, z_2, \ldots, z_N)}{\partial z_n} \right|_{z_1=z_{1i}, z_2=z_{2i}, \ldots, z_N=z_{Ni}} z_n \leq \quad \text{(Eq. 6'')}$$

$$-E_{Up} - \sum_{n=1}^{N} \left. \frac{\partial f_p(z_1, z_2, \ldots, z_N)}{\partial z_n} \right|_{z_1=z_{1i}, z_2=z_{2i}, \ldots, z_N=z_{Ni}} z_{ni} +$$

$$f_p(z_{1i}, z_{2i}, \ldots, z_{Ni})$$

Since Eq. 3 is generally valid only in the vicinity of ($z_{1i}$, $z_{2i}$, ..., $z_{Ni}$), in case the desired constraints $E_{Lp} \leq f_p$ ($z_1$, $z_2$, ..., $z_N$) $\leq E_{Up}$ cannot be achieved in such vicinity, which can be determined by any conflict among the inequalities, the constants $E_{Lp}$ and $E_{Up}$ can be relaxed until the constraints are achievable. This optimization process minimizes the worst defect size in the vicinity of ($z_{1i}$, $z_{2i}$, ..., $z_{Ni}$). Then each step reduces the worst defect size gradually, and each step is executed iteratively until certain terminating conditions are met. This will lead to optimal reduction of the worst defect size.

Another way to minimize the worst defect is to adjust the weight $w_p$ in each iteration. For example, after the i-th iteration, if the r-th evaluation point is the worst defect, $w_r$ can be increased in the (i+1)-th iteration so that the reduction of that evaluation point's defect size is given higher priority.

In addition, the cost functions in Eq. 4 and Eq. 5 can be modified by introducing a Lagrange multiplier to achieve compromise between the optimization on RMS of the defect size and the optimization on the worst defect size, i.e., $$CF(z_1, z_2, \ldots, z_N) = \quad \text{(Eq. 6''')}$$

$$(1-\lambda) \sum_{p=1}^{P} w_p f_p^2(z_1, z_2, \ldots, z_N) + \lambda \max_{1 \leq p \leq P} \frac{f_p(z_1, z_2, \ldots, z_N)}{CL_p}$$

where $\lambda$ is a preset constant that specifies the trade-off between the optimization on RMS of the defect size and the optimization on the worst defect size. In particular, if $\lambda=0$, then this becomes Eq. 4 and the RMS of the defect size is only minimized; while if $\lambda=1$, then this becomes Eq. 5 and the worst defect size is only minimized; if $0<\lambda<1$, then both are taken into consideration in the optimization. Such optimization can be solved using multiple methods. For example, the weighting in each iteration may be adjusted, similar to the one described previously. Alternatively, similar to minimizing the worst defect size from inequalities, the inequalities of Eq. 6' and 6" can be viewed as constraints of the design variables during solution of the quadratic programming problem. Then, the bounds on the worst defect size can be relaxed incrementally or increase the weight for the worst defect size incrementally, compute the cost function value for every achievable worst defect size, and choose the design variable values that minimize the total cost function as the initial point for the next step. By doing this iteratively, the minimization of this new cost function can be achieved.

Optimizing a lithographic projection apparatus can expand the process window. A larger process window provides more flexibility in process design and chip design. The process window can be defined as a set of focus and dose values for which the resist image are within a certain limit of the design target of the resist image. Note that all the methods discussed here may also be extended to a generalized process window definition that can be established by different or additional base parameters in addition to exposure dose and defocus. These may include, but are not limited to, optical settings such as NA, sigma, aberrations, polarization, or optical constants of the resist layer. For example, as described earlier, if the PW also consists of different mask bias, then the optimization includes the minimization of MEEF (Mask Error Enhancement Factor), which is defined as the ratio between the substrate EPE and the induced mask edge bias. The process window defined on focus and dose values only serve as an example in this disclosure. A method of maximizing the process window, according to an embodiment, is described below.

In a first step, starting from a known condition $(f_0, \varepsilon_0)$ in the process window, wherein $f_0$ is a nominal focus and $\varepsilon_0$ is a nominal dose, minimizing one of the cost functions below in the vicinity $(f_0 \pm \Delta f, \varepsilon_0 \pm \Delta \varepsilon)$:

$$CF(z_1, z_2, \ldots, z_N, f_0, \varepsilon_0) = \max_{(f,\varepsilon)=(f_0 \pm \Delta f, \varepsilon_0 \pm \Delta \varepsilon)} \max_p |f_p(z_1, z_2, \ldots, z_N, f, \varepsilon)|. \quad \text{(Eq. 7)}$$

or $$CF(z_1, z_2, \ldots, z_N, f_0, \varepsilon_0) = \sum_{(f,\varepsilon)=(f_0 \pm \Delta f, \varepsilon_0 \pm \Delta \varepsilon)} \sum_p w_p f_p^2(z_1, z_2, \ldots, z_N, f, \varepsilon) \quad \text{(Eq. 7')}$$

or $$CF(z_1, z_2, \ldots, z_N, f_0, \varepsilon_0) = \quad \text{(Eq. 7'')}$$
$$(1-\lambda) \sum_{(f,\varepsilon)=(f_0 \pm \Delta f, \varepsilon_0 \pm \Delta \varepsilon)} \sum_p w_p f_p^2(z_1, z_2, \ldots, z_N, f, \varepsilon) +$$
$$\lambda \max_{(f,\varepsilon)=(f_0 \pm \Delta f, \varepsilon_0 \pm \Delta \varepsilon)} \max_p |f_p(z_1, z_2, \ldots, z_N, f, \varepsilon)|$$

If the nominal focus $f_0$ and nominal dose $\varepsilon_0$ are allowed to shift, they can be optimized jointly with the design variables $(z_1, z_2, \ldots, z_N)$. In the next step, $(f_0 \pm \Delta f, \varepsilon_0 \pm \Delta \varepsilon)$ is accepted as part of the process window, if a set of values of $(z_1, z_2, \ldots, z_N, f, \varepsilon)$ can be found such that the cost function is within a preset limit.

Alternatively, if the focus and dose are not allowed to shift, the design variables $(z_1, z_2, \ldots, z_N)$ are optimized with the focus and dose fixed at the nominal focus $f_0$ and nominal dose $\varepsilon_0$. In an alternative embodiment, $(f_0 \pm \Delta f, \varepsilon_0 \pm \Delta \varepsilon)$ is accepted as part of the process window, if a set of values of $(z_1, z_2, \ldots, z_N)$ can be found such that the cost function is within a preset limit.

The methods described earlier in this disclosure can be used to minimize the respective cost functions of Eqs. 7, 7', or 7". If the design variables are characteristics of the projection optics, such as the Zernike coefficients, then minimizing the cost functions of Eqs. 7, 7', or 7" leads to process window maximization based on projection optics optimization, i.e., LO. If the design variables are characteristics of the source and patterning device in addition to those of the projection optics, then minimizing the cost function of Eqs. 7, 7', or 7" leads to process window maximizing based on SMLO, as illustrated in FIG. 11. If the design variables are characteristics of the source and patterning device and, then minimizing the cost functions of Eqs. 7, 7', or 7" leads to process window maximization based on SMO. The cost functions of Eqs. 7, 7', or 7" can also include at least one $f_p$ $(z_1, z_2, \ldots, z_N)$ such as that in Eq. 7 or Eq. 8, that is a function of one or more stochastic effects such as the LWR or local CD variation of 2D features, and throughput.

Figure 14:
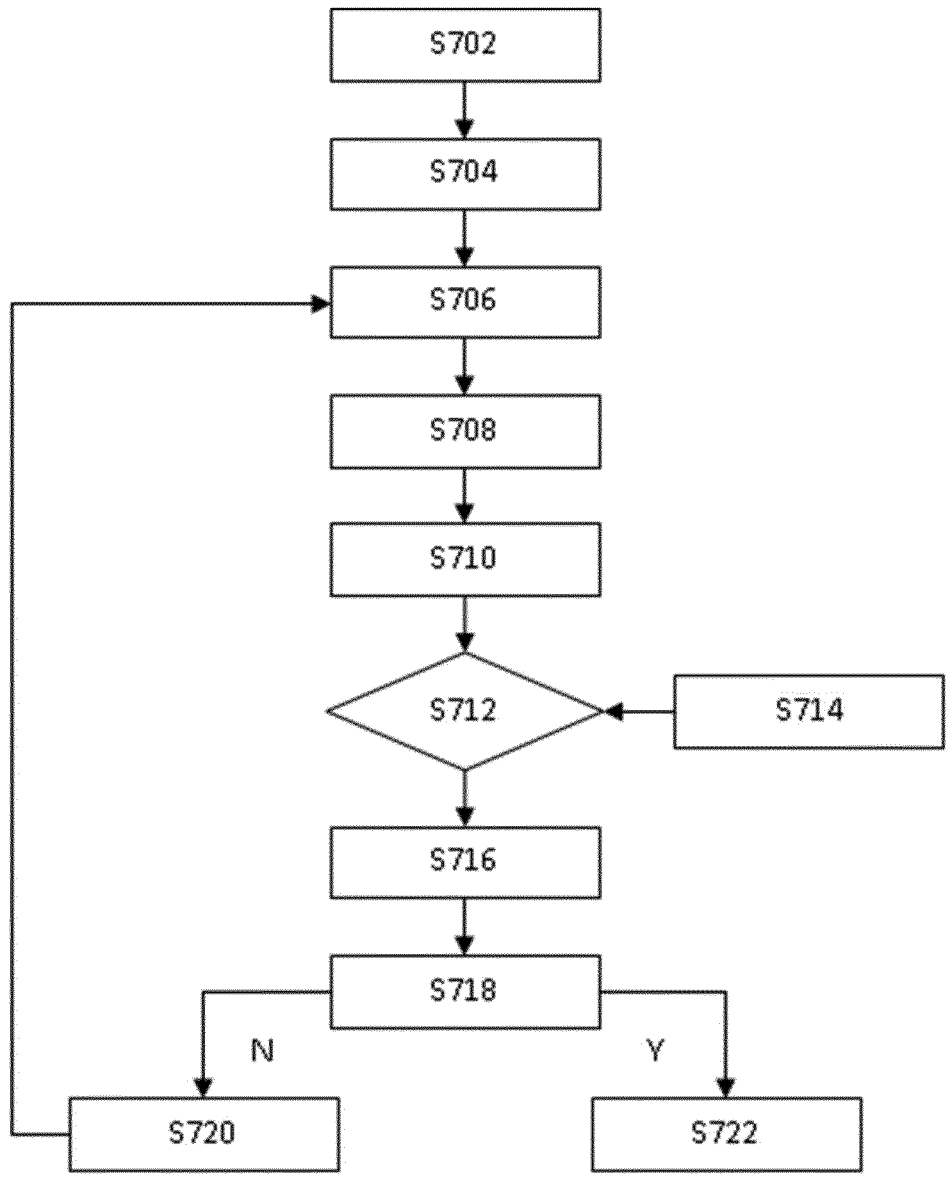

FIG. 14 shows one specific example of how a simultaneous SMLO process can use a Gauss Newton Algorithm for optimization. In step S702, starting values of design variables are identified. Tuning ranges for each variable may also be identified. In step S704, the cost function is defined using the design variables. In step S706 cost function is expanded around the starting values for all evaluation points in the design layout. In optional step S710, a full-chip simulation is executed to cover all critical patterns in a full-chip design layout. Desired lithographic response metric (such as CD or EPE) is obtained in step S714, and compared with predicted values of those quantities in step S712. In step S716, a process window is determined. Steps S718, S720, and S722 are similar to corresponding steps S514, S516 and S518, as described with respect to FIG. 13A. As mentioned before, the final output may be a wavefront aberration map in the pupil plane, optimized to produce the desired imaging performance. The final output may also be an optimized source map and/or an optimized design layout.

Figure 13B:
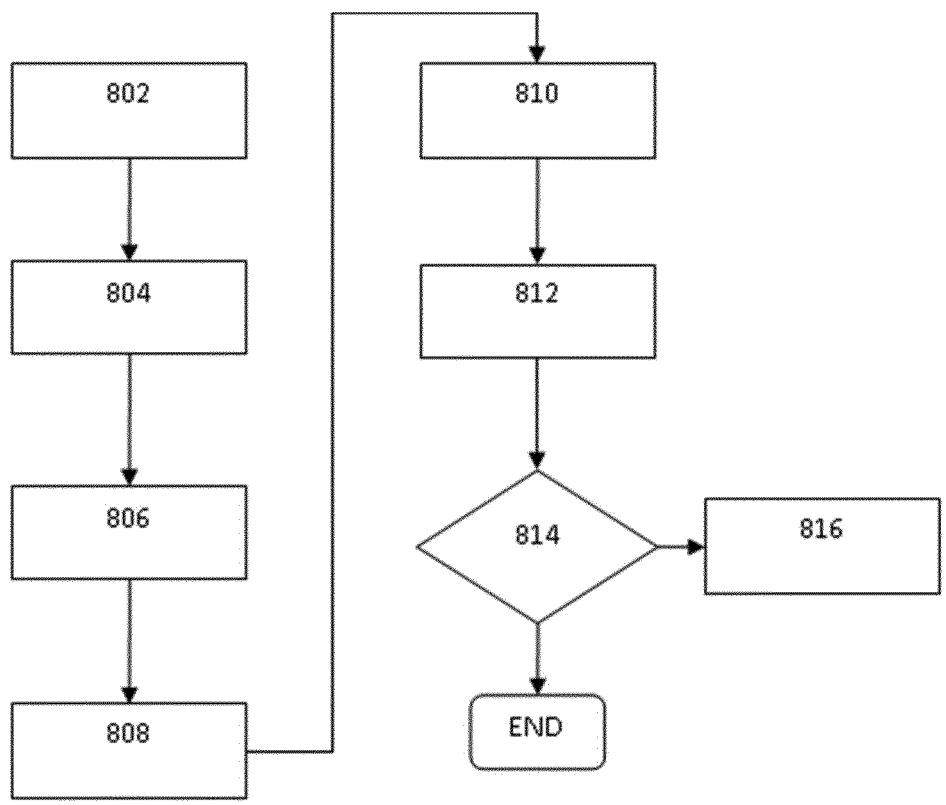

FIG. 13B shows an exemplary method to optimize the cost function where the design variables $(z_1, z_2, \ldots, z_N)$ include design variables that may only assume discrete values.

The method starts by defining the pixel groups of the illumination source and the patterning device tiles of the patterning device (step 802). Generally, a pixel group or a patterning device tile may also be referred to as a division of a lithographic process component. In one exemplary approach, the illumination source is divided into 117 pixel groups, and 94 patterning device tiles are defined for the patterning device, substantially as described above, resulting in a total of 211 divisions.

In step 804, a lithographic model is selected as the basis for photolithographic simulation. Photolithographic simulations produce results that are used in calculations of photolithographic metrics, or responses. A particular photolithographic metric is defined to be the performance metric that is to be optimized (step 806). In step 808, the initial (pre-optimization) conditions for the illumination source and the patterning device are set up. Initial conditions include initial states for the pixel groups of the illumination source and the patterning device tiles of the patterning device such that references may be made to an initial illumination shape and an initial patterning device pattern. Initial conditions may also include mask bias, NA, and focus ramp range. Although steps 802, 804, 806, and 808 are depicted as sequential steps, it will be appreciated that in other embodiments of the invention, these steps may be performed in other sequences.

In step 810, the pixel groups and patterning device tiles are ranked. Pixel groups and patterning device tiles may be interleaved in the ranking Various ways of ranking may be employed, including: sequentially (e.g., from pixel group 1 to pixel group 117 and from patterning device tile 1 to patterning device tile 94), randomly, according to the physical locations of the pixel groups and patterning device tiles (e.g., ranking pixel groups closer to the center of the illumination source higher), and according to how an alteration of the pixel group or patterning device tile affects the performance metric.

Once the pixel groups and patterning device tiles are ranked, the illumination source and patterning device are adjusted to improve the performance metric (step 812). In step 812, each of the pixel groups and patterning device tiles are analyzed, in order of ranking, to determine whether an alteration of the pixel group or patterning device tile will result in an improved performance metric. If it is determined that the performance metric will be improved, then the pixel group or patterning device tile is accordingly altered, and the resulting improved performance metric and modified illumination shape or modified patterning device pattern form the baseline for comparison for subsequent analyses of lower-ranked pixel groups and patterning device tiles. In other words, alterations that improve the performance metric are retained. As alterations to the states of pixel groups and patterning device tiles are made and retained, the initial illumination shape and initial patterning device pattern changes accordingly, so that a modified illumination shape and a modified patterning device pattern result from the optimization process in step 812.

In other approaches, patterning device polygon shape adjustments and pairwise polling of pixel groups and/or patterning device tiles are also performed within the optimization process of 812.

In an alternative embodiment the interleaved simultaneous optimization procedure may include to alter a pixel group of the illumination source and if an improvement of the performance metric is found, the dose is stepped up and down to look for further improvement. In a further alternative embodiment, the stepping up and down of the dose or intensity may be replaced by a bias change of the patterning device pattern to look for further improvement in the simultaneous optimization procedure.

In step 814, a determination is made as to whether the performance metric has converged. The performance metric may be considered to have converged, for example, if little or no improvement to the performance metric has been witnessed in the last several iterations of steps 810 and 812. If the performance metric has not converged, then the steps of 810 and 812 are repeated in the next iteration, where the modified illumination shape and modified patterning device from the current iteration are used as the initial illumination shape and initial patterning device for the next iteration (step 816).

The optimization methods described above may be used to increase the throughput of the lithographic projection apparatus. For example, the cost function may include an $f_p$ $(z_1, z_2, \ldots, z_N)$ that is a function of the exposure time. Optimization of such a cost function is preferably constrained or influenced by a measure of the stochastic effects or other metrics. Specifically, a computer-implemented method for increasing a throughput of a lithographic process may include optimizing a cost function that is a function of one or more stochastic effects of the lithographic process and a function of an exposure time of the substrate, in order to minimize the exposure time.

In one embodiment, the cost function includes at least one $f_p(z_1, z_2, \ldots, z_N)$ that is a function of one or more stochastic effects. The stochastic effects may include the failure of a feature, LWR or local CD variation of 2D features. In one embodiment, the stochastic effects include stochastic variations of characteristics of a resist image. For example, such stochastic variations may include failure rate of a feature, line edge roughness (LER), line width roughness (LWR) and critical dimension uniformity (CDU). Including stochastic variations in the cost function allows finding values of design variables that minimize the stochastic variations, thereby reducing risk of defects due to stochastic effects.

In an embodiment, there is provided a method for determining a component of optical characteristic of a patterning process. The method involves obtaining (i) a plurality of desired features, (ii) a plurality of simulated features based on the plurality of desired features and an optical characteristic of the patterning process, and (iii) a performance metric related to a desired feature of the plurality of desired features and an associated simulated feature of the plurality of simulated features; determining a set of optical sensitivities of the patterning process by computing a change in value of the performance metric based on a change in value of the optical characteristic; and identifying, based on the set of optical sensitivities, a set of components of the optical characteristic that comprise dominant contributors in changing the value of the performance metric.

In an embodiment, the identifying the set of components of the optical characteristic involves performing a principal component analysis on the set of optical sensitivities; and determining a linear combination of the optical characteristic that accounts for substantial variations within the set of optical sensitivities.

In an embodiment, the dominant contributors comprise the linear combination of the optical characteristic.

In an embodiment, the optical characteristic characterizes an optical aberration of an optical system of the patterning apparatus.

In an embodiment, the optical characteristic is defined by a Zernike polynomial.

In an embodiment, a component of the set of components of the optical characteristic is a coefficient of the Zernike polynomial.

In an embodiment, the component corresponds to a correctable Zernike coefficient, wherein the correctable Zernike coefficient is tunable via an adjustment mechanism of the patterning apparatus.

In an embodiment, the linear combination includes a correctable Zernike coefficient and a non-correctable Zernike coefficient, wherein the non-correctable Zernike coefficient is not tunable via an adjustment mechanism of the patterning apparatus.

In an embodiment, the correctable Zernike coefficient is a low order Zernike coefficient.

In an embodiment, the computing the change in the performance metric involves overlapping the desired feature and the simulated feature; and measuring a difference in a particular direction between overlapping contours of the desired feature and the simulated feature.

In an embodiment, the difference is measured in a horizontal direction and/or a vertical direction.

In an embodiment, the obtaining the plurality of desired features involves simulating a patterning process model with an ideal optical characteristic and perturbing values of a process parameter, wherein the ideal optical characteristic comprises no optical aberration.

In an embodiment, the obtaining the plurality of simulated features involves simulating the patterning process model with the plurality of desired features and by perturbing values related to the optical characteristics and the values of the process parameter to obtain the plurality of simulated features associated with the plurality of desired features.

In an embodiment, the process parameter is at least one of dose and/or focus.

In an embodiment, the method further involves adjusting, via an adjusting mechanism, one or more mirrors of the patterning apparatus based on the set of components of the optical characteristic to improve a performance metric of the patterning process.

In an embodiment, the adjusting the one or more mirrors involves obtaining an optical correction potential of the patterning apparatus, wherein the correction potential is a relationship between Zernike coefficients and orders that are correctable or non-correctable via the adjusting mechanism of the patterning apparatus; identifying mirrors of the optical system of the patterning apparatus corresponding to the correctable Zernike coefficients within the set of components of the optical characteristic; and manipulating the identified mirrors to compensate for effects of the non-correctable Zernike coefficients such that the performance metric of the patterning process is improved.

In an embodiment, the performance metric is at least one of an edge placement error, critical dimension, and/or displacement between edges of two features on a substrate.

Furthermore, in an embodiment, there is provided a method of source mask optimization based on optical sensitivity of a patterning process. The method involves obtaining (i) a set of optical sensitivities, and (ii) a set of components including an optical characteristic that are dominant contributors to variations in the set of optical sensitivities; determining, via a patterning process model, source pattern or mask pattern based on the set of components including the optical characteristic such that a performance metric of the patterning process is improved.

In an embodiment, the determining the source pattern or the mask pattern is an iterative process. An iteration involves simulating the patterning process model with the set of components including the optical characteristic and perturbing a parameter related to the source pattern and/or the mask pattern; determining the performance metric based on the simulation results; determining values of the parameter related to the source pattern and/or the mask pattern such that the performance metric is improved.

In an embodiment, the performance metric is at least one of an edge placement error, critical dimension, and/or displacement between edges of two features on a substrate.

In an embodiment, the improving of the performance metric comprises minimizing the edge placement error.

In an embodiment, the patterning process model is a source model, a mask model, an optics model, a resist model, and/or an etch model.

In an embodiment, the parameter of the source model is at least one of an illumination mode, and intensity.

In an embodiment, the parameter of the mask model is at least one of: a placement location of an assist feature, a size of the feature, a shape of the assist feature, and/or a distance between two assist features.

Furthermore, in an embodiment, there is provided a computer program product comprising a non-transitory computer readable medium having instructions recorded thereon, the instructions when executed by a computer system implementing the aforementioned methods.

Figure 15:
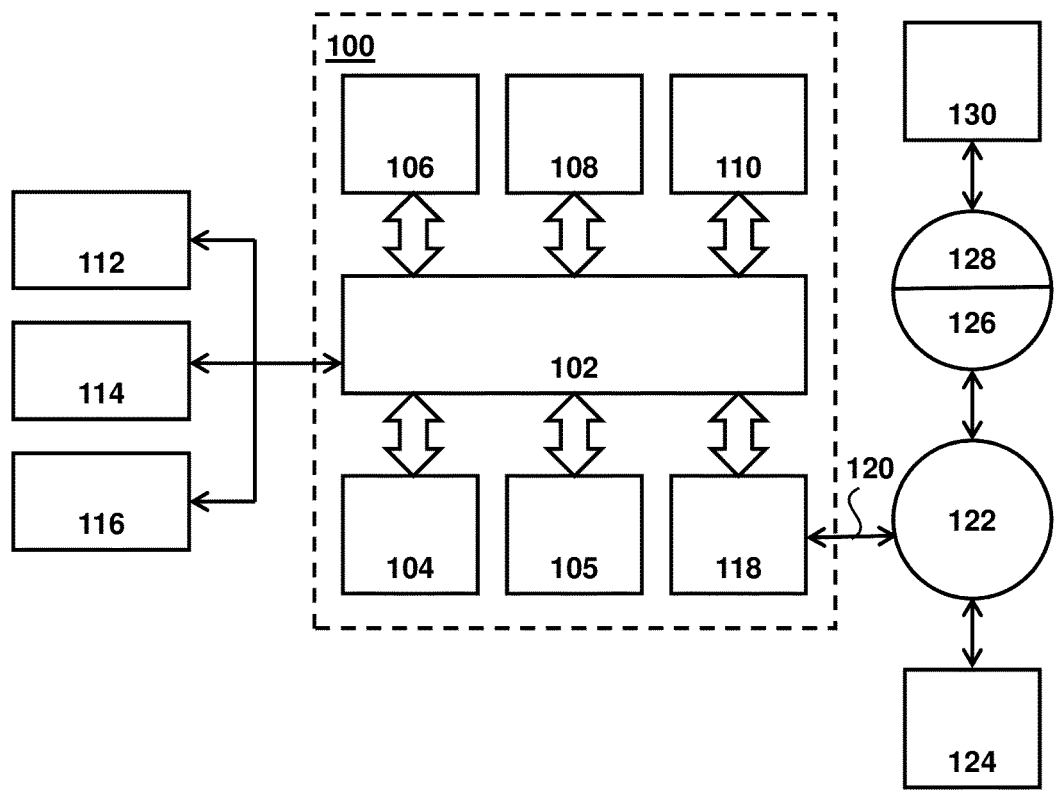
FIG. 15 is a block diagram of an example computer system in which embodiments can be implemented, according to an embodiment.

FIG. 15 is a block diagram that illustrates a computer system 100 which can assist in implementing the optimization methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of a process described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions. Thus, embodiments are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with one or more embodiments, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 16:
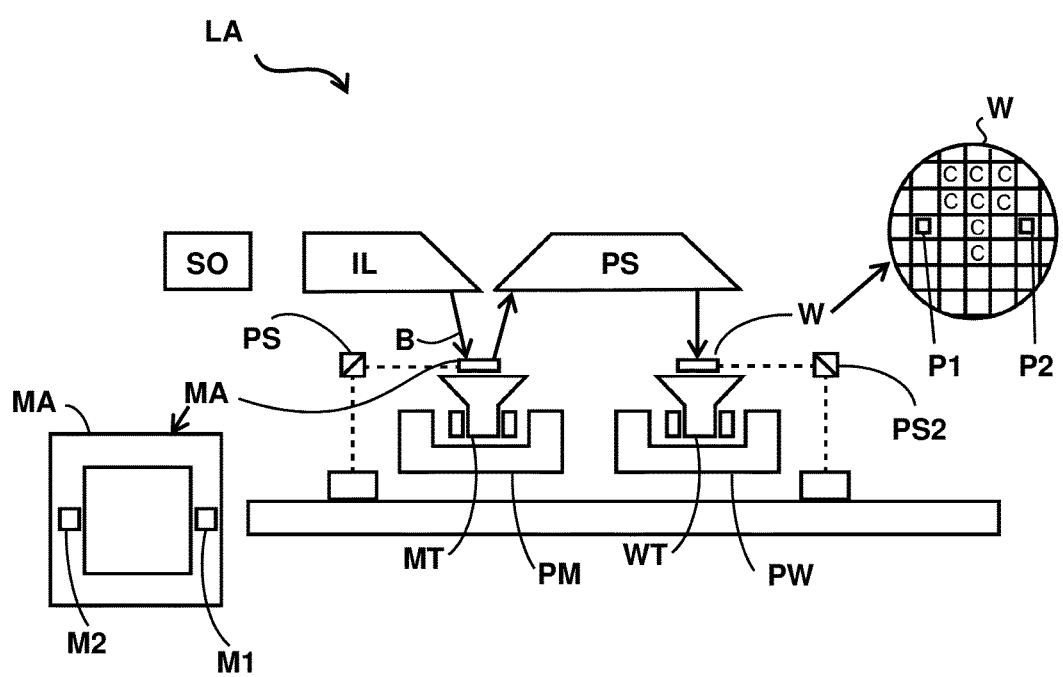
FIG. 16 is a schematic diagram of another lithographic projection apparatus, according to an embodiment.

FIG. 16 schematically depicts another exemplary lithographic projection apparatus LA that includes:

a source collector module SO to provide radiation.

an illumination system (illuminator) IL configured to condition a radiation beam B (e.g. EUV radiation) from the source collector module SO.

a support structure (e.g. a mask table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

As here depicted, the apparatus LA is of a reflective type (e.g. employing a reflective mask). It is to be noted that because most materials are absorptive within the EUV wavelength range, the patterning device may have multi-layer reflectors comprising, for example, a multi-layer stack of molybdenum and silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 16, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 16, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the radiation source may be an integral part of the source collector module, for example when the radiation source is a discharge produced plasma EUV generator, often termed as a DPP radiation source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus LA could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 17:
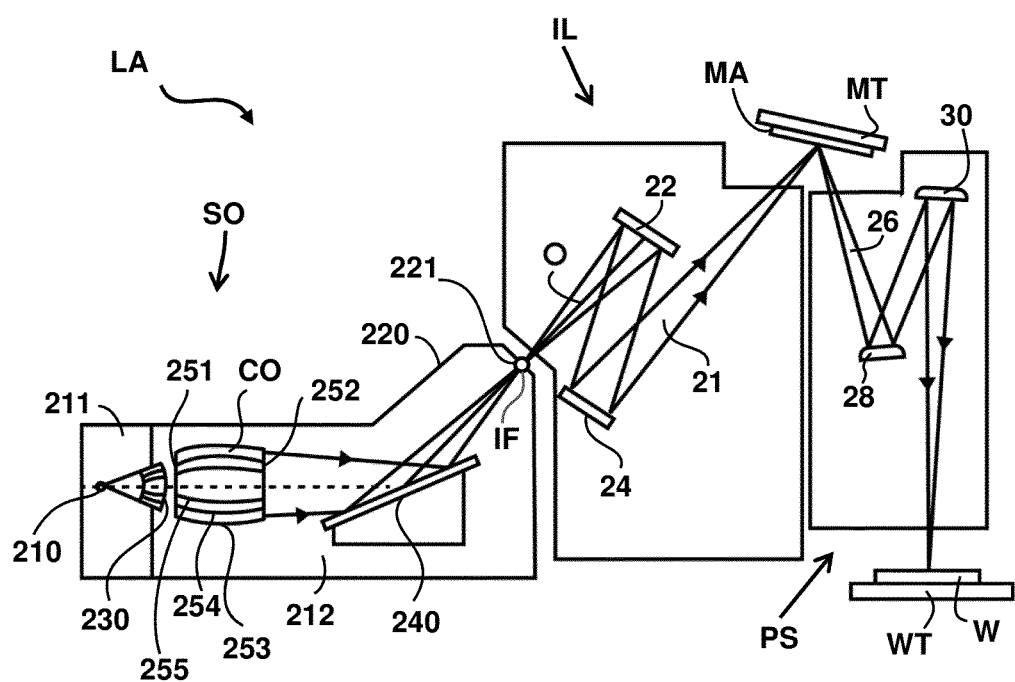
FIG. 17 is a more detailed view of the apparatus in FIG. 16, according to an embodiment.

FIG. 17 shows the apparatus LA in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma radiation source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 17.

Collector optic CO, as illustrated in FIG. 17, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is desirably used in combination with a discharge produced plasma radiation source.

Figure 18:
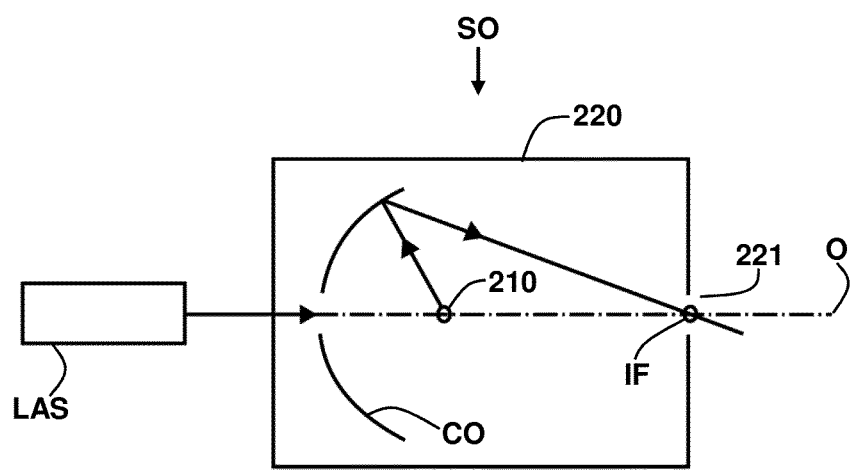
FIG. 18 is a more detailed view of the source collector module of the apparatus of FIG. 16 and FIG. 17, according to an embodiment.

Alternatively, the source collector module SO may be part of an LPP radiation system as shown in FIG. 18. A laser LAS is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The embodiments may further be described using the following clauses:

1. A method for determining a component of optical characteristic of a patterning process, the method comprising:

obtaining (i) a plurality of desired features, (ii) a plurality of simulated features based on the plurality of desired features and an optical characteristic of the patterning process, and (iii) a performance metric related to a desired feature of the plurality of desired features and an associated simulated feature of the plurality of simulated features;

determining a set of optical sensitivities of the patterning process by computing a change in value of the performance metric based on a change in value of the optical characteristic; and identifying, based on the set of optical sensitivities, a set of components of the optical characteristic that comprise dominant contributors in changing the value of the performance metric.

2. The method of clause 1, wherein the identifying the set of components of the optical characteristic comprises:

performing a principal component analysis on the set of optical sensitivities; and determining a linear combination of the optical characteristic that accounts for substantial variations within the set of optical sensitivities.

3. The method of any of clauses 1-2, wherein the dominant contributors comprise the linear combination of the optical characteristic.

4. The method of any of clauses 1-3, wherein the optical characteristic characterizes an optical aberration of an optical system of the patterning apparatus.

5. The method of clause 4, wherein the optical characteristic is defined by a Zernike polynomial.

6. The method of clause 5, wherein a component of the set of components of the optical characteristic is a coefficient of the Zernike polynomial.

7. The method of clause 6, wherein the component corresponds to a correctable Zernike coefficient, wherein the correctable Zernike coefficient is tunable via an adjustment mechanism of the patterning apparatus.

8. The method of any of clause 6-7, wherein the linear combination includes a correctable Zernike coefficient and a non-correctable Zernike coefficient, wherein the non-correctable Zernike coefficient is not tunable via an adjustment mechanism of the patterning apparatus.

9. The method of clause 8, wherein the correctable Zernike coefficient is a low order Zernike coefficient.

10. The method of any of clauses 1-9, wherein the computing the change in the performance metric comprises:

overlapping the desired feature and the simulated feature; and measuring a difference in a particular direction between overlapping contours of the desired feature and the simulated feature.

11. The method of any of clauses 1-10, wherein the difference is measured in a horizontal direction and/or a vertical direction.

12. The method of any of clauses 1-11, wherein the obtaining the plurality of desired features comprises:
simulating a patterning process model with an ideal optical characteristic and perturbing values of a process parameter, wherein the ideal optical characteristic comprises no optical aberration.

13. The method of any of clauses 1-12, wherein the obtaining the plurality of simulated features comprises:

simulating the patterning process model with the plurality of desired features and by perturbing values related to the optical characteristics and the values of the process parameter to obtain the plurality of simulated features associated with the plurality of desired features.

14. The method of any of clauses 12-13, wherein the process parameter is at least one of dose and/or focus.

15. The method of any of clauses 1-14, further comprising:

adjusting, via an adjusting mechanism, one or more mirrors of the patterning apparatus based on the set of components of the optical characteristic to improve a performance metric of the patterning process.

16. The method of clause 15, wherein the adjusting the one or more mirrors comprises:

obtaining an optical correction potential of the patterning apparatus, wherein the correction potential is a relationship between Zernike coefficients and orders that are correctable or non-correctable via the adjusting mechanism of the patterning apparatus;

identifying mirrors of the optical system of the patterning apparatus corresponding to the correctable Zernike coefficients within the set of components of the optical characteristic; and manipulating the identified mirrors to compensate for effects of the non-correctable Zernike coefficients such that the performance metric of the patterning process is improved.

17. The method of any of clauses 15-16, wherein the performance metric is at least one of an edge placement error, critical dimension, and/or displacement between edges of two features on a substrate.

18. A method of source mask optimization based on optical sensitivity of a patterning process, the method comprising:

obtaining (i) a set of optical sensitivities, and (ii) a set of components including an optical characteristic that are dominant contributors to variations in the set of optical sensitivities;

determining, via a patterning process model, source pattern or mask pattern based on the set of components including the optical characteristic such that a performance metric of the patterning process is improved.

19. The method of clause 18, wherein the determining the source pattern or the mask pattern is an iterative process, an iteration comprises:

simulating the patterning process model with the set of components including the optical characteristic and perturbing a parameter related to the source pattern and/or the mask pattern;

determining the performance metric based on the simulation results;

determining values of the parameter related to the source pattern and/or the mask pattern such that the performance metric is improved.

20. The method of any of clauses 18-16, wherein the performance metric is at least one of an edge placement error, critical dimension, and/or displacement between edges of two features on a substrate.

21. The method of any of clauses 18-20, wherein the improving of the performance metric comprises minimizing the edge placement error.

22. The method of any of clauses 18-21, wherein the patterning process model is a source model, a mask model, an optics model, a resist model, and/or an etch model.

23. The method of any of clauses 18-22, wherein the parameter of the source model is at least one of an illumination mode, and intensity.

24. The method of any of clauses 18-22, wherein the parameter of the mask model is at least one of: a placement location of an assist feature, a size of the feature, a shape of the assist feature, and/or a distance between two assist features.

25. A computer program product comprising a non-transitory computer readable medium having instructions recorded thereon, the instructions when executed by a computer system implementing the method of any of clauses 1-24.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although specific reference may be made in this text to the use of embodiments in the manufacture of ICs, it should be understood that the embodiments herein may have many other possible applications. For example, it may be employed in the manufacture of integrated optical systems, guidance and detection patterns for magnetic domain memories, liquid-crystal displays (LCDs), thin film magnetic heads, micromechanical systems (MEMs), etc. The skilled artisan will appreciate that, in the context of such alternative applications, any use of the terms "reticle", "wafer" or "die" herein may be considered as synonymous or interchangeable with the more general terms "patterning device", "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create, for example, a multilayer IC, so that the term substrate used herein may also refer to a substrate that already contains multiple processed layers.

In the present document, the terms "radiation" and "beam" as used herein encompass all types of electromagnetic radiation, including ultraviolet radiation (e.g. with a wavelength of about 365, about 248, about 193, about 157 or about 126 nm) and extreme ultra-violet (EUV) radiation (e.g. having a wavelength in the range of 5-20 nm), as well as particle beams, such as ion beams or electron beams.

The terms "optimizing" and "optimization" as used herein refers to or means adjusting a patterning apparatus (e.g., a lithography apparatus), a patterning process, etc. such that results and/or processes have more desirable characteristics, such as higher accuracy of projection of a design pattern on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

Aspects of the invention can be implemented in any convenient form. For example, an embodiment may be implemented by one or more appropriate computer programs which may be carried on an appropriate carrier medium which may be a tangible carrier medium (e.g. a disk) or an intangible carrier medium (e.g. a communications signal). Embodiments of the invention may be implemented using suitable apparatus which may specifically take the form of a programmable computer running a computer program arranged to implement a method as described herein. Thus, embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, these inventions have been grouped into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary sections of the present document should be taken as containing a comprehensive listing of all such inventions or all aspects of such inventions.

It should be understood that the description and the drawings are not intended to limit the present disclosure to the particular form disclosed, but to the contrary, the intention is to cover all modifications, equivalents, and alternatives falling within the spirit and scope of the inventions as defined by the appended claims.

Modifications and alternative embodiments of various aspects of the inventions will be apparent to those skilled in the art in view of this description. Accordingly, this description and the drawings are to be construed as illustrative only and are for the purpose of teaching those skilled in the art the general manner of carrying out the inventions. It is to be understood that the forms of the inventions shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every. References to selection from a range includes the end points of the range.

In the above description, any processes, descriptions or blocks in flowcharts should be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

While certain embodiments have been described, these embodiments have been presented by way of example only, and are not intended to limit the scope of the present disclosures. Indeed, the novel methods, apparatuses and systems described herein can be embodied in a variety of other forms; furthermore, various omissions, substitutions and changes in the form of the methods, apparatuses and systems described herein can be made without departing from the spirit of the present disclosures. The accompanying claims and their equivalents are intended to cover such forms or modifications as would fall within the scope and spirit of the present disclosures.

What is claimed is:

1. A method comprising:
   obtaining (i) a plurality of desired features, (ii) a plurality of simulated features based on the plurality of desired features and an optical characteristic of a patterning process, and (iii) a performance metric related to a desired feature of the plurality of desired features and an associated simulated feature of the plurality of simulated features;
   determining a set of optical sensitivities of the patterning process by computing a change in value of the performance metric based on a change in value of the optical characteristic; and
   identifying, by a hardware computer system based on the set of optical sensitivities, a set of one or more components of the optical characteristic that comprises one or more dominant contributors in changing the value of the performance metric.

2. The method of claim 1, wherein the identifying the set of one or more components of the optical characteristic comprises:
   performing a principal component analysis on the set of optical sensitivities; and
   determining, from the principal component analysis, a combination of the optical characteristic that accounts for substantial variations within the set of optical sensitivities.

3. The method of claim 1, wherein the one or more dominant contributors comprise a linear combination of the optical characteristic.

4. The method of claim 1, wherein the optical characteristic characterizes an optical aberration of an optical system of a patterning apparatus.

5. The method of claim 4, wherein the optical characteristic is represented by a Zernike polynomial.

6. The method of claim 5, wherein a component of the set of one or more components of the optical characteristic is a coefficient of the Zernike polynomial.

7. The method of claim 6, wherein the component corresponds to a correctable Zernike coefficient, wherein the correctable Zernike coefficient is tunable via an adjustment mechanism of the patterning apparatus.

8. The method of claim 6, wherein the set of one or more components includes a correctable Zernike coefficient and a non-correctable Zernike coefficient, wherein the non-correctable Zernike coefficient is not tunable via an adjustment mechanism of the patterning apparatus.

9. The method of claim 8, wherein the correctable Zernike coefficient is a low order Zernike coefficient.

10. The method of claim 1, wherein the computing the change in the performance metric comprises:
    overlapping the desired feature and the associated simulated feature; and
    determining a difference, in a particular direction, between overlapping contours of the desired feature and the associated simulated feature.

11. The method of claim 1, wherein the obtaining the plurality of desired features comprises simulating using a patterning process model with an ideal optical characteristic and perturbing values of a process parameter, wherein the ideal optical characteristic comprises no optical aberration, and/or
   wherein the obtaining the plurality of simulated features comprises simulating using a patterning process model with the plurality of desired features and perturbing values related to the optical characteristic and of a process parameter to obtain the plurality of simulated features associated with the plurality of desired features.

12. The method of claim 11, wherein the process parameter is dose and/or focus.

13. The method of claim 1, further comprising:
    adjusting, via an adjusting mechanism, one or more mirrors of a patterning apparatus based on the set of one or more components of the optical characteristic and based on a performance metric of the patterning process, wherein the adjusting the one or more mirrors comprises:
    obtaining an optical correction potential of the patterning apparatus, wherein the correction potential represents a relationship between Zernike coefficients and orders that are correctable or non-correctable via the adjusting mechanism of the patterning apparatus;
    identifying one or more mirrors of an optical system of the patterning apparatus corresponding to correctable Zernike coefficients within the set of one or more components of the optical characteristic; and
    manipulating the identified one or more mirrors to compensate for effects of non-correctable Zernike coefficients based on the performance metric of the patterning process.

14. The method of claim 1, wherein the performance metric is at least one selected from: an edge placement error, critical dimension, and/or displacement between edges of two features on a substrate.

15. A computer program product comprising a non-transitory computer readable medium having instructions therein, the instructions, when executed by a computer system, configured to cause the computer system to at least:
    obtain (i) a plurality of desired features, (ii) a plurality of simulated features based on the plurality of desired features and an optical characteristic of a patterning process, and (iii) a performance metric related to a desired feature of the plurality of desired features and an associated simulated feature of the plurality of simulated features;
    determine a set of optical sensitivities of the patterning process by computing a change in value of the performance metric based on a change in value of the optical characteristic; and
    identify, based on the set of optical sensitivities, a set of one or more components of the optical characteristic that comprises one or more dominant contributors in changing the value of the performance metric.

16. The computer program product of claim 15, wherein the instructions configured to cause the computer system to identify the set of one or more components of the optical characteristic are further configured to cause the computer system to:
    perform a principal component analysis on the set of optical sensitivities; and
    determine, from the principal component analysis, a combination of the optical characteristic that accounts for substantial variations within the set of optical sensitivities.

17. The computer program product of claim 15, wherein the one or more dominant contributors comprise a linear combination of the optical characteristic.

18. The computer program product of claim 15, wherein the optical characteristic characterizes an optical aberration of an optical system of a patterning apparatus.

19. The computer program product of claim 18, wherein the optical characteristic is represented by a Zernike polynomial.

20. The computer program product of claim 15, wherein the performance metric is at least one selected from: an edge placement error, critical dimension, and/or displacement between edges of two features on a substrate.

* * * * *